US012640186B2

(12) United States Patent
Shen et al.

(10) Patent No.: US 12,640,186 B2
(45) Date of Patent: May 26, 2026

(54) MEMORY DEVICE AND SYSTEM, AND DECODING CIRCUIT

(71) Applicant: YANGTZE MEMORY TECHNOLOGIES CO., LTD., Wuhan (CN)

(72) Inventors: Xuesong Shen, Wuhan (CN); Zhichao Du, Wuhan (CN); Daesik Song, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 56 days.

(21) Appl. No.: 18/396,557

(22) Filed: Dec. 26, 2023

(65) Prior Publication Data

US 2025/0174267 A1 May 29, 2025

Related U.S. Application Data

(63) Continuation of application No. PCT/CN2023/134734, filed on Nov. 28, 2023.

(51) Int. Cl.
*G11C 11/408* (2006.01)
*G06F 12/06* (2006.01)
*G11C 11/4076* (2006.01)

(52) U.S. Cl.
CPC .......... *G11C 11/4087* (2013.01); *G06F 12/06* (2013.01); *G11C 11/4076* (2013.01); *G11C 11/4085* (2013.01)

(58) Field of Classification Search
CPC . G11C 11/4087; G11C 11/06; G11C 11/4076; G11C 11/4085

(Continued)

(56) References Cited

U.S. PATENT DOCUMENTS

| | | | |
|---|---|---|---|
| 5,915,167 A | 6/1999 | Leedy | |
| 2008/0253218 A1 | 10/2008 | Park | |

(Continued)

FOREIGN PATENT DOCUMENTS

| | | |
|---|---|---|
| CN | 1509475 A | 6/2004 |
| CN | 102201254 A | 9/2011 |

(Continued)

OTHER PUBLICATIONS

Supplementary European Search Report issued in corresponding European Application No. EP 23925599.5, mailed on Apr. 15, 2025, 12 pages.

(Continued)

*Primary Examiner* — Connie C Yoha
(74) *Attorney, Agent, or Firm* — BAYES PLLC

(57) ABSTRACT

The present disclosure provides a memory device and system, and a decoding circuit. The memory device includes a memory cell array and a peripheral circuit coupled with the memory cell array; the memory cell array includes at least one block, and the block is provided with multiple rows of word lines, multiple columns of bit lines, and memory cells coupled between the word lines and the bit lines; the peripheral circuit includes a column decoding circuit; the column decoding circuit is coupled with the multiple columns of bit lines and configured to receive a column address signal, perform multi-stage decoding on the column address signal, and output a column select signal indicative of enabling a respective bit line in the block.

20 Claims, 11 Drawing Sheets

(58) Field of Classification Search
USPC ..................................................... 365/230.03
See application file for complete search history.

(56) References Cited

U.S. PATENT DOCUMENTS

| | | | |
|---|---|---|---|
| 2011/0075503 A1 | 3/2011 | Kwack et al. | |
| 2016/0099033 A1 | 4/2016 | Lal et al. | |
| 2019/0180804 A1 | 6/2019 | Min | |
| 2022/0013162 A1* | 1/2022 | Kadowaki | G11C 11/4076 |
| 2022/0028471 A1* | 1/2022 | Shang | G11C 29/36 |
| 2023/0096616 A1 | 3/2023 | Jeong | |
| 2024/0221819 A1* | 7/2024 | Du | G11C 11/4085 |
| 2025/0174266 A1* | 5/2025 | Du | H01L 25/0657 |
| 2025/0299724 A1* | 9/2025 | Gangasani | G11C 11/4087 |

FOREIGN PATENT DOCUMENTS

| | | |
|---|---|---|
| CN | 111968692 A | 11/2020 |
| JP | 2000195261 A | 7/2000 |
| JP | 2002230968 A | 8/2002 |
| JP | 2008527585 A | 7/2008 |
| JP | 2008262666 A | 10/2008 |
| KR | 10-2008-0092087 A | 10/2008 |
| KR | 20180123728 A | 11/2018 |
| TW | 302483 B | 4/1997 |
| TW | 200849258 A | 12/2008 |
| TW | 201911318 A | 3/2019 |
| TW | 202307856 A | 2/2023 |

OTHER PUBLICATIONS

Notice of Reasons for Refusal issued in corresponding Japanese Application No. 2024-553692, mailed on Jan. 9, 2026, 11 pages.

* cited by examiner

MEMORY DEVICE AND SYSTEM, AND DECODING CIRCUIT

CROSS-REFERENCE TO RELATED APPLICATIONS

This application is a continuation of International Application No. PCT/CN2023/134734, filed on Nov. 28, 2023, which is incorporated herein by reference in its entirety.

TECHNICAL FIELD

Implementations of the present disclosure relate to the technical field of semiconductors, and particularly to a memory device and system, and a decoding circuit.

BACKGROUND

A memory device and a system thereof are storage apparatuses for saving information in modern information technologies. With the increasingly high requirements for the storage apparatuses, there is still much room for improvements in the memory device and the system thereof.

SUMMARY

Implementations of the present disclosure provide a memory device and system, and a decoding circuit.

In a first aspect, implementations of the present disclosure provide a memory device, comprising: a memory cell array and a peripheral circuit coupled with the memory cell array, wherein: the memory cell array comprises at least one block, and the block is provided with multiple rows of word lines, multiple columns of bit lines, and memory cells coupled between the word lines and the bit lines; the peripheral circuit comprises a column decoding circuit; the column decoding circuit is coupled with the multiple columns of bit lines and configured to receive a column address signal, perform multi-stage decoding on the column address signal, and output a column select signal indicative of enabling a respective bit line in the block.

In some implementations, the column decoding circuit comprises: a first stage column decoding circuit comprising a first input interface and a first output interface, wherein the first input interface at least receives the column address signal, the first output interface outputs a preliminary column decoded signal, and the number of transmission lines corresponding to the column address signal is less than the number of transmission lines corresponding to the preliminary column decoded signal; and a second stage column decoding circuit comprising a second input interface and a second output interface, wherein the second input interface is coupled with the first stage column decoding circuit and receives the preliminary column decoded signal, the second output interface is coupled with a plurality of bit lines in the block and outputs a column decoded signal indicative of enabling one of the plurality of bit lines in the block, and the number of the transmission lines corresponding to the preliminary column decoded signal is less than the number of transmission lines corresponding to the column decoded signal.

In some implementations, the memory cell array comprises a plurality of banks, each comprising several rows of blocks and several columns of blocks; each of the banks corresponds to a plurality of first stage column decoding circuits and a plurality of second stage column decoding circuits, each of the first stage column decoding circuits corresponds to one column of blocks, and each of the second stage column decoding circuits corresponds to one block of one column of blocks; the second input interface of each of the second stage column decoding circuits is coupled with the first stage column decoding circuit, the second output interface is coupled with a plurality of bit lines of one of the blocks, and the column decoded signal is indicative of enabling a respective bit line in a selected block.

In some implementations, the column address signal comprises multiple bits of data; the first stage column decoding circuit comprises: a first decoding circuit configured to perform decoding processing on multiple consecutive low-order bits of data in the column address signal to obtain a first decoded signal; and a second decoding circuit configured to perform decoding processing on remaining multiple consecutive high-order bits of data in the column address signal to obtain a second decoded signal; the first decoded signal and the second decoded signal are configured to form the preliminary column decoded signal jointly.

In some implementations, the first stage column decoding circuit further comprises: a synchronization control signal generation circuit configured to generate a synchronization control signal corresponding to a clock period less than a clock period corresponding to the first decoded signal and the second decoded signal; the second input interface of the second stage column decoding circuit further receives the synchronization control signal, and the second stage column decoding circuit is configured to output the column decoded signal in response to an enabled state of the synchronization control signal and normal output of the first decoded signal and the second decoded signal.

In some implementations, the second stage column decoding circuit is configured to receive the synchronization control signal and a semiconductor element enable signal and, when the synchronization control signal and a block enable signal are both enabled, output the column decoded signal to enable a bit line in a selected block corresponding to an enabled data bit of the preliminary column decoded signal; and the block enable signal being enabled represents that the block is selected.

In some implementations, the first stage column decoding circuit further comprises: a drive circuit comprising a plurality of drivers; each driver is connected with one of a plurality of transmission lines corresponding to the first decoded signal and the second decoded signal respectively, and is configured to perform power amplification processing on a decoded signal on a respective transmission line.

In some implementations, the block comprises a first region and a second region, and numbers of bit lines disposed in the first region and the second region are the same; the first stage column decoding circuit further comprises: a third decoding circuit, a first region select circuit, and a second region select circuit; the third decoding circuit is configured to perform decoding processing on the remaining multiple consecutive high-order bits of data in the column address signal to obtain a third decoded signal; the third decoded signal and the second decoded signal are the same; the first region select circuit is connected with the second decoding circuit and configured to output the second decoded signal when a first region enable signal is enabled; the second region select circuit is connected with the third decoding circuit and configured to output the third decoded signal when a second region enable signal is enabled; the first region enable signal/second region enable signal being enabled represents that the first region/second region of the block is selected.

In some implementations, the first stage column decoding circuit further comprises: a buffer; the buffer is connected with the first decoding circuit and configured to perform timing adjustment on the first decoded signal for synchronization with output signals of both the first region select circuit and the second region select circuit.

In some implementations, the column address signal is 6-bit binary data, the preliminary column decoded signal corresponds to 24 transmission lines, the first region of the block comprises 64 bit lines, and the second region of the block comprises 64 bit lines.

In some implementations, the memory comprises a plurality of address transmission lines and a plurality of data transmission lines; the first stage column decoding circuit corresponding to one column of blocks is connected with a second stage column decoding circuit corresponding to each block in the one column of blocks through the plurality of address transmission lines; each block in the one column of blocks are connected with the data transmission lines; the plurality of address transmission lines and the plurality of data transmission lines are disposed in the same metal layer.

In some implementations, the memory cell array is disposed on a first semiconductor structure, and the peripheral circuit is disposed on a second semiconductor structure; the first semiconductor structure and the second semiconductor structure are disposed as being stacked and are electrically connected by means of bonding; each of the first stage column decoding circuits is disposed on a side of a respective column of blocks; each of the second stage column decoding circuits, as well as a sensing amplifier and a word-line driver corresponding to each block, is disposed at a position of an orthographic projection of one respective block on a plane where the second semiconductor structure is located.

In some implementations, the memory device comprises a dynamic random access memory.

In a second aspect, implementations of the present disclosure provide a memory system, comprising the memory devices as described in the above solutions; and a memory controller coupled with the memory devices and controlling the memory devices.

In a second aspect, implementations of the present disclosure provide a decoding circuit, comprising: a first stage decoding circuit comprising a first input interface and a first output interface, wherein the first input interface at least receives a signal to be decoded, the first output interface outputs a preliminary decoded signal, and the number of transmission lines corresponding to the signal to be decoded is less than the number of transmission lines corresponding to the preliminary decoded signal; and a second stage decoding circuit comprising a second input interface and a second output interface, wherein the second input interface is coupled with the first stage decoding circuit and receives the preliminary decoded signal, the second output interface is coupled with a plurality of structures to be selected in a semiconductor element and outputs a decoded signal indicative of enabling one structure to be selected in the semiconductor element, and the number of the transmission lines corresponding to the preliminary decoded signal is less than the number of transmission lines corresponding to the decoded signal.

In some implementations, there are a plurality of second stage decoding circuits, each corresponding to one semiconductor element; the second input interface of each of the second stage decoding circuits is coupled with the first stage decoding circuit, the second output interface is coupled with a plurality of structures to be decoded of the one semiconductor element, and the decoded signal is indicative of enabling a respective structure to be decoded in a selected semiconductor element.

In some implementations, the signal to be decoded comprises multiple bits of data; the first stage decoding circuit comprises: a first decoding circuit configured to perform decoding processing on multiple consecutive low-order bits of data in the signal to be decoded, so as to obtain a first decoded signal; and a second decoding circuit configured to perform decoding processing on remaining multiple consecutive high-order bits of data in the signal to be decoded, so as to obtain a second decoded signal; the first decoded signal and the second decoded signal are configured to form the preliminary decoded signal jointly.

In some implementations, the first stage decoding circuit further comprises: a synchronization control signal generation circuit configured to generate a synchronization control signal corresponding to a clock period less than a clock period corresponding to the first decoded signal and the second decoded signal; the second input interface of the second stage decoding circuit further receives the synchronization control signal, and the second stage decoding circuit is configured to output the decoded signal in response to an enabled state of the synchronization control signal and normal output of the first decoded signal and the second decoded signal.

In some implementations, the second stage decoding circuit is configured to receive the synchronization control signal and a semiconductor element enable signal and, when the synchronization control signal and the semiconductor element enable signal are both enabled, output the decoded signal to enable a structure to be selected in a selected semiconductor element corresponding to an enabled data bit of the preliminary decoded signal; and the semiconductor element enable signal being enabled represents that the semiconductor element is selected.

In some implementations, the first stage decoding circuit further comprises: a drive circuit comprising a plurality of drivers; each driver is connected with one of a plurality of transmission lines corresponding to the first decoded signal and the second decoded signal respectively, and is configured to perform power amplification processing on a decoded signal on a respective transmission line.

In some implementations, the first stage decoding circuit further comprises: a third decoding circuit, a first region select circuit, and a second region select circuit; the third decoding circuit is configured to perform decoding processing on the remaining multiple consecutive high-order bits of data in the signal to be decoded, to obtain a third decoded signal; the third decoded signal and the second decoded signal are the same; the first region select circuit is connected with the second decoding circuit and configured to output the second decoded signal when a first region enable signal is enabled; the second region select circuit is connected with the third decoding circuit and configured to output the third decoded signal when a second region enable signal is enabled; the first region enable signal/second region enable signal being enabled represents that a first region/second region of the semiconductor element is selected.

In some implementations, the first stage decoding circuit further comprises: a buffer; the buffer is connected with the first decoding circuit and configured to perform timing adjustment on the first decoded signal for synchronization with output signals of both the first region select circuit and the second region select circuit.

In some implementations, the first region select circuit/second region select circuit comprises: a first NAND gate and a second NAND gate; an input end of the first NAND gate is connected with an output of the second decoding circuit/the third decoding circuit, and the other input end is configured to receive a partition enable signal; the partition enable signal being enabled represents that the semiconductor element supports partition selection; an input end of the second NAND gate is connected with an output end of the first NAND gate, the other input end is configured to receive the first region enable signal/second region enable signal, and an output end is connected with the first output interface.

In some implementations, the signal to be decoded comprises a column address signal; the transmission lines comprise address transmission lines; the semiconductor element comprises a block, and the plurality of structures to be selected comprise a plurality of bit lines; the decoded signal is indicative of selecting one of the plurality of bit lines.

BRIEF DESCRIPTION OF THE DRAWINGS

In the drawings, unless otherwise stated, like reference numerals used throughout a plurality of drawings denote same or like components or elements. These drawings are not necessarily drawn to scale. It is to be understood that these drawings depict only some implementations in accordance with the present disclosure, and are not to be considered as limitations to the scope of the present disclosure.

DETAILED DESCRIPTION

Figures 1, 2A:
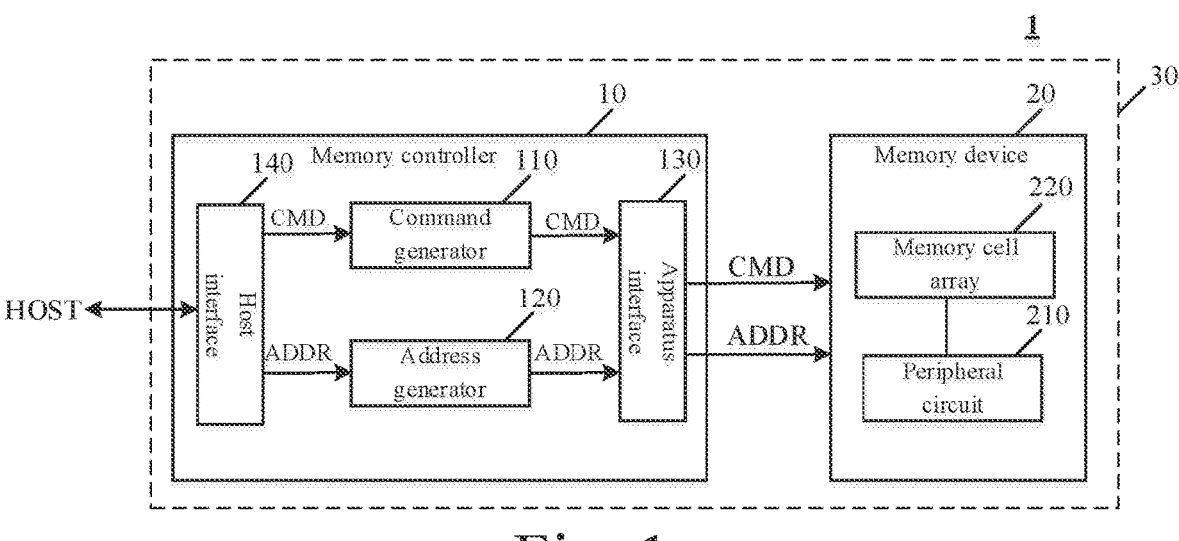
FIG. 1 is a compositional block diagram of an example electronic apparatus of an implementation of the present disclosure.
FIG. 2A is a compositional block diagram of an example solid-state drive (SSD) or universal flash storage (UFS) of an implementation of the present disclosure.

Example implementations of the present disclosure will be described below in detail with reference to the drawings. Although the drawings show example implementations of the present disclosure, it is to be understood that, the present disclosure may be implemented in any form which is not limited by the example implementations as set forth herein. Rather, these implementations are provided in order to understand the present disclosure more thoroughly, and can fully convey the scope of the present disclosure to those skilled in the art.

In the description below, many example details are presented to provide a more thorough understanding of the present disclosure. However, it is apparent to those skilled in the art that the present disclosure may be carried out without one or more of these details. In other implementations, in order to avoid confusing with the present disclosure, some technical features well-known in the art are not described; that is, not all features of actual implementations are described herein, and well-known functions and structures are not described in detail.

In the drawings, sizes and relative sizes of layers, areas and elements may be exaggerated for clarity. Like reference numerals denote like elements throughout.

It is to be understood that when an element or a layer is referred to as being "on", "adjacent to", "connected to", or "coupled to" other elements or layers, it may be directly on, adjacent to, connected to, or coupled to the other elements or layers, or one or more intervening elements or layers may be present. In contrast, when an element is referred to as being "directly on", "immediately adjacent to", "directly connected to", or "directly coupled to" other elements or layers, no intervening elements or layers are present. It is to be understood that, although the terms first, second, and third, etc., may be used to describe various elements, components, areas, layers and/or portions, these elements, components, areas, layers and/or portions should not be limited by these terms. These terms are only used to distinguish one element, component, area, layer or portion from another element, component, area, layer or portion. Thus, a first element, component, area, layer or portion discussed below may be represented as a second element, component, area, layer or portion, without departing from the teachings of the present disclosure. When the second element, component, area, layer or portion is discussed, it does not mean that the first element, component, area, layer or portion is necessarily present in the present disclosure.

The spatially relative terms, such as "beneath", "below", "lower", "under", "over", and "upper", etc., may be used herein for ease of description to describe one element or feature's relationship to other elements or features as illustrated in the figures. It is to be understood that, the spatially relative terms are intended to further encompass different orientations of a device in use or operation in addition to the orientation depicted in the figures. For example, if a device in the drawings is turned over, then an element or a feature described as "below other elements", or "under other elements", or "beneath other elements" will be orientated to be "above" the other elements or features. Thus, the example terms, "below" and "beneath", may include both upper and lower orientations. The device may be orientated otherwise (rotated by 90 degrees or other orientations), and the spatially descriptive terms used herein are interpreted accordingly.

The terms used herein are only intended to describe the implementations, and are not used as limitations of the present disclosure. As used herein, unless otherwise indicated expressly in the context, "a", "one" and "the" in a singular form are also intended to include a plural form. It is also to be understood that the terms "consist of" and/or "comprise", when used in this specification, determine the presence of a feature, integer, step, operation, element and/or component, but do not preclude the presence or addition of one or more of other features, integers, steps, operations, elements, components, and/or groups. As used herein, the term "and/or" includes any and all combinations of the listed relevant items. Units, "stick", "strip" and "piece", of transmission lines represent the same meaning.

In order to understand the characteristics and the technical contents of the implementations of the present disclosure in more details, implementations of the implementations of the present disclosure is set forth in detail below in conjunction with the drawings, and the appended drawings are only used for reference and illustration, instead of being used to limit the implementations of the present disclosure.

FIG. 1 illustrates a compositional block diagram of an example electronic apparatus according to an implementation of the present disclosure. The electronic apparatus 1 may be a mobile phone, a desktop computer, a laptop computer, a tablet computer, a vehicle computer, a gaming console, a printer, a pointing apparatus, a wearable electronic apparatus, a smart sensor, a virtual reality (VR) apparatus, an augmented reality (AR) apparatus, or any other suitable electronic apparatuses having storages therein. As shown in FIG. 1, the electronic apparatus 1 may comprise a host HOST and a memory system 30, wherein the memory system 30 comprises a memory controller 10 and one or more memory devices 20. The host HOST may be a processor (e.g., a Central Processing Unit (CPU)) or a Graphic Processing Unit (GPU)) of the electronic apparatus. The host HOST may be configured to send or receive data to or from the memory device 20. The memory controller 10 is coupled to the memory device 20 and the host HOST and is configured to control the memory device 20. The memory controller 10 can manage data stored in the memory device 20 and communicate with the host HOST.

The memory controller 10 may be configured to control operations of the memory device 20, such as read, erase, write, and refresh operations. In some implementations, the memory controller 10 is further configured to process an Error Correction Code (ECC) with respect to data read from or written to the memory device 20. The memory controller 10 may further perform any other suitable functions, e.g., formatting the memory device 20.

In some implementations, the memory controller 10 and the one or more memory devices 20 can all be integrated into various types of electronic apparatuses. For example, the memory controller 10 may be integrated into a north bridge of a computer motherboard or directly integrated into a computer CPU, and a plurality of memory devices 20 may be integrated into a memory bar. That is, the memory system 30 may be implemented and packaged into different types of end electronic products.

The memory controller 10 may send data to/receive data from the host HOST and may send a command CMD and an address ADDR to the memory device 20. The memory controller 10 may comprise a command generator 110, an address generator 120, an apparatus interface 130, and a host interface 140. The host interface 140 may receive a command CMD and an address ADDR from the host HOST, and the command generator 110 may generate an access command, and a row hammer refresh command, etc. by decoding the command CMD received from the host HOST and may provide the access command and the row hammer refresh command to the memory device 20 through the apparatus interface 130. The access command may be a signal instructing the memory device 20 to write or read data by accessing a row of a memory cell array 220 corresponding to the address ADDR. The row hammer refresh command may be a signal commanding the memory device 20 to perform an additional refresh operation on a word line adjacent to a word line that is accessed frequently during a short period of time. In other words, the additional refresh operation may be performed on the word line adjacent to the word line that is accessed for multiple times during the short period of time.

The address generator 120 in the memory controller 10 may generate a row address and a column address to be accessed in the memory cell array 220 by decoding the address ADDR received from the host interface 140. Further, the memory device 20 may generate an address of a bank to be accessed when the memory cell array 220 comprises a plurality of banks.

Furthermore, the memory controller 10 may control memory operations, such as writing and reading, by providing various signals to the memory device 20 via the apparatus interface 130. For example, the memory controller 10 may provide a write command to the memory device 20. The write command is used to instruct the memory device 20 to perform a write operation to save data into the memory device 20.

In some implementations, the memory device 20 comprises the memory cell array 220 and a peripheral circuit 210, wherein the memory cell array 220 comprises a plurality of banks, each bank comprises a plurality of blocks, each block comprises a plurality of memory cell rows and a plurality of memory cell columns, each memory cell row is coupled with one corresponding word line, and each memory cell column is coupled with one corresponding bit line. The peripheral circuit 210 may write data to or read data from the memory cell array 220 based on the command CMD and the address ADDR received from the memory controller 10, or may provide a control signal CTRL for refreshing a memory cell included in the memory cell array 220 to a row decoding circuit and a column decoding circuit. In other words, the peripheral circuit 210 may perform all operations to process the data in the memory cell array 220. The peripheral circuit 210 may comprise: control circuits corresponding to each block, e.g., a Sensing Amplifier (SA) and a Word-Line Driver (WLD), etc., control circuits corresponding to each bank, e.g., the row decoding circuit and the column decoding circuit, etc., and control circuits corresponding to all the banks, e.g., a command buffer, a command decoder, an address buffer, a data input/output buffer, and a mode register, etc.

The memory device 20 may be a random access memory (RAM), such as a Dynamic Random Access Memory (DRAM), a Synchronous DRAM (SDRAM), a Static RAM (SRAM), a Double Data Rate SDRAM (DDR SDRAM), a DDR2 SDRAM, a DDR3 SDRAM, a phase change RAM (PRAM), a magnetic RAM (MRAM), and a resistive RAM (RRAM), etc. Only the DRAM is taken as an example for description below.

FIG. 2A is a compositional block diagram of an example SSD/UFS of an implementation of the present disclosure. In some implementations, the SSD/UFS may be understood as one of above memory systems in FIG. 1, and in this example, the DRAM may be used as a buffer memory.

As shown in FIG. 2A, the SSD/UFS 30' may comprise an SSD/UFS controller 10', a buffer memory 20', and a non-volatile memory 40. The SSD/UFS controller 10' may provide a physical connection between the host HOST and the SSD/UFS 30'. That is, the SSD/UFS controller 10' may provide an interface between the host HOST and the SSD/UFS 30' in accordance with a bus format of the host. The SSD controller 10' may decode an instruction provided by the host HOST. The SSD/UFS controller 10' may access the non-volatile memory 40 based on a decoding result. The buffer memory 20' may temporarily store written data provided by the host HOST, or data read from the non-volatile memory 40. When the host HOST issues a read request, if the data present in the non-volatile memory 40 is cached, the buffer memory 20' may support a caching function for providing the cached data directly to the host HOST. A rate of data transfer through the bus format (e.g., a SATA or SAS) of the host is much higher than a data transfer rate of a memory channel of the SSD/UFS 30'. That is, when an interface speed of the host is significantly high, a performance degradation due to a speed difference may be minimized by providing a high-capacity buffer memory 20'. In addition, the buffer memory 20' may store an address mapping table of the non-volatile memory 40. The buffer memory 20' may include, but is not limited to, a DRAM. The non-volatile memory 40 may be disposed as a storage medium of the SSD/UFS 30'. The non-volatile memory 40 may include, but is not limited to, a NAND memory.

Figure 2B:
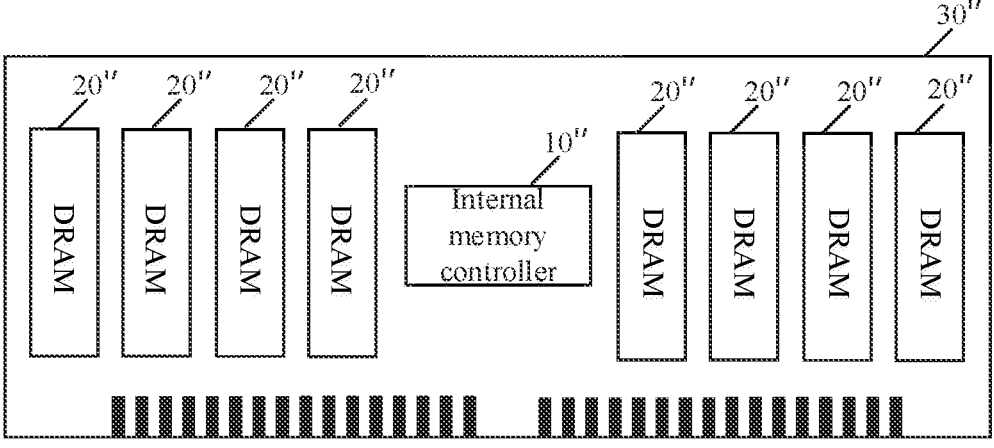
FIG. 2B is a compositional block diagram of an example internal memory of an implementation of the present disclosure.

FIG. 2B is a compositional block diagram of an example internal memory of an implementation of the present disclosure. In some implementations, the internal memory may be understood as one of the above memory systems in FIG. 1, and in this example, the DRAM may be used as a storage medium.

As shown in FIG. 2B, the internal memory 30" is readily attachable or mountable to or removable from the electronic apparatus 1 through an illustrated interface. The internal memory 30" may comprise a plurality of volatile memories 20" (e.g., DRAMs) and a internal memory controller 10". The memory module memory 30" may be used to write data, store data, acquire (or read) data, and/or erase data under control of a computer processor. In some implementations, the controller memory controller 10" may communicate with the DRAMs using at least one communication protocol or technical standard generally associated with, e.g., a dual in-line internal memory (DIMM), a registered DIMM (RDIMM), a load-reduced DIMM (LRDIMM), and an unregistered DIMM (UDIMM), etc.

It is to be noted that the buffer memory 20' in FIG. 2A and the volatile memories 20" in FIG. 2B are each an application scenario of the memory device 20 in FIG. 1, and may be also applicable to other application scenarios, which are not limited here.

Figure 3:
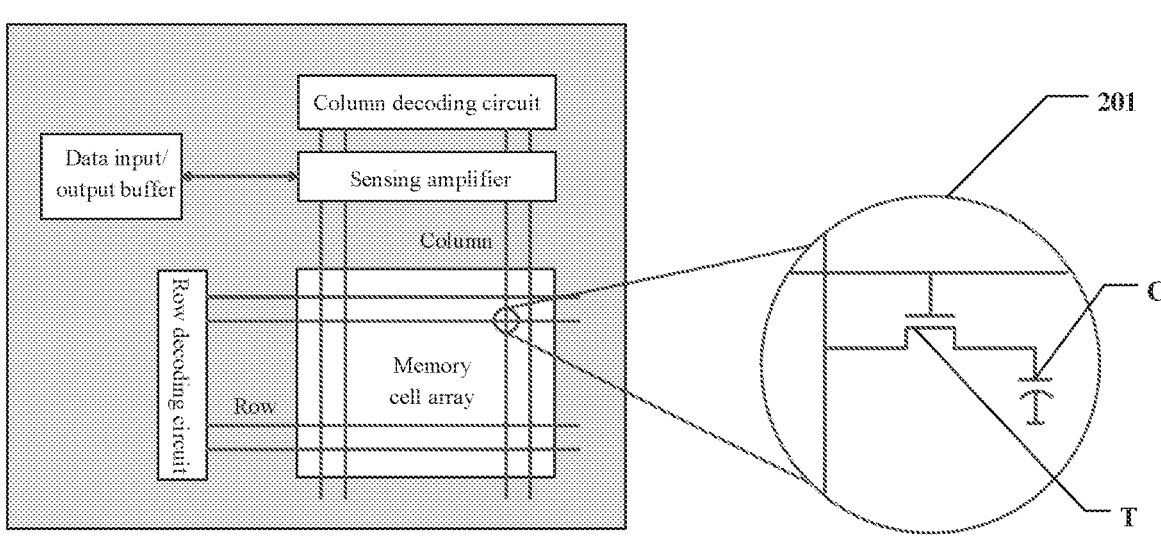
FIG. 3 is a compositional structural schematic diagram of an example dynamic random access memory of an implementation of the present disclosure.
Figure 4:
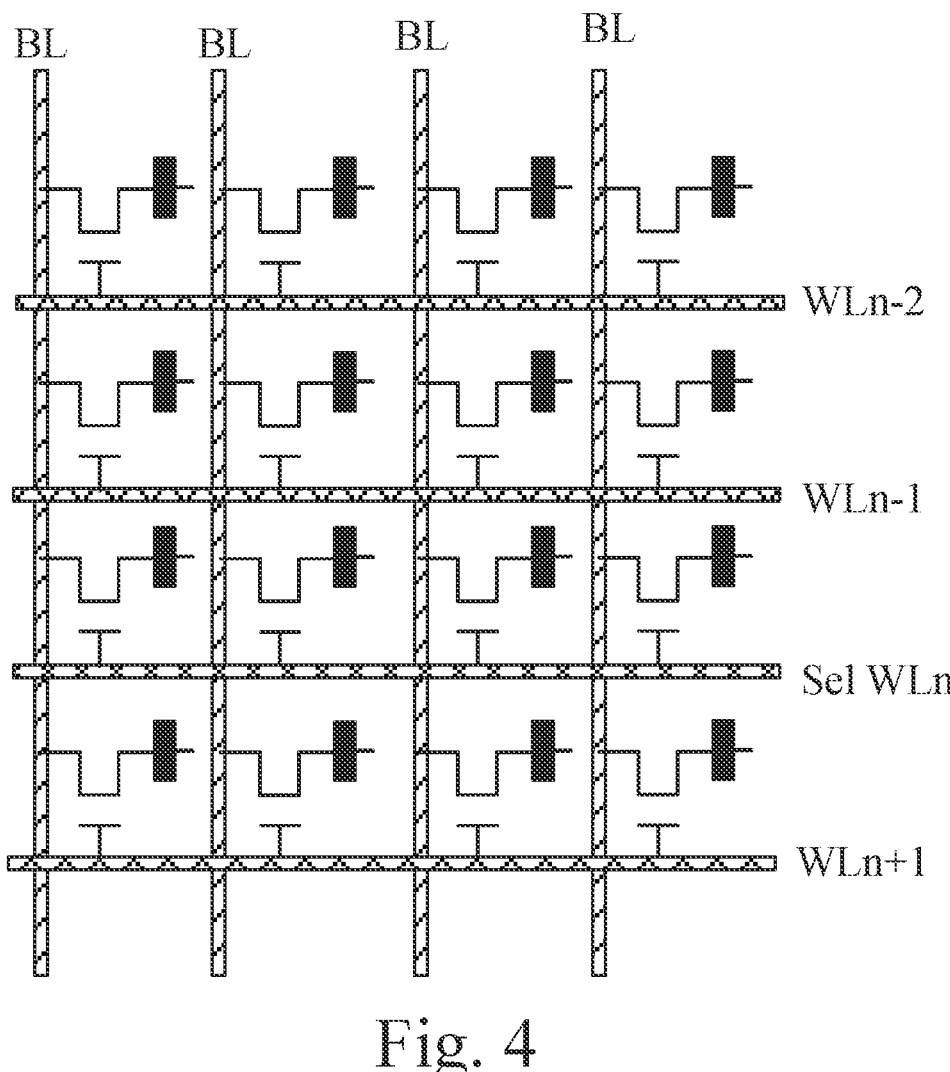
FIG. 4 is a schematic diagram of a connection relationship of word lines, bit lines, and memory cells of the example dynamic random access memory of an implementation of the present disclosure.

FIG. 3 is a compositional structural schematic diagram of an example dynamic random access memory of an implementation of the present disclosure. FIG. 4 is a schematic diagram of a connection relationship of bit lines, word lines, and memory cells of the example dynamic random access memory of an implementation of the present disclosure.

FIG. 3 shows a circuit of a memory cell in the DRAM at a right side thereof. The DRAM comprises at least one DRAM die, each DRAM die comprises a memory cell array, the memory cell array comprises a plurality of memory cells 201 arranged in an array, and each memory cell 201 comprises one transistor T and one capacitor C. A main function principle of the memory cell is to use an amount of charges stored in the capacitor to represent a binary bit as 1 or 0. The memory cells are arranged in an array, which may be regarded as a typical mesh structure that may be referred to FIG. 4 for details. The memory cell array uses a row and a column to designate an address. By designating an intersection of a row and a column (by designating a row address and a column address of the DRAM), the memory controller can access each memory cell in the DRAM die independently and perform a read, write, or refresh operation on data stored in the memory cell.

FIG. 3 shows the memory cell array and part of peripheral circuits in the DRAM at a left side thereof. It is to be noted that, in response to an address input to the row decoding circuit, a row decoding circuit selects a word line so as to select a memory cell row to be accessed. The row decoding circuit decodes the input address and enables (activates) the word line corresponding to the decoded address. A column decoding circuit selects one or more bit lines to input a user's output data to a portion of the memory cell row corresponding to the selected word line.

Figure 5A:
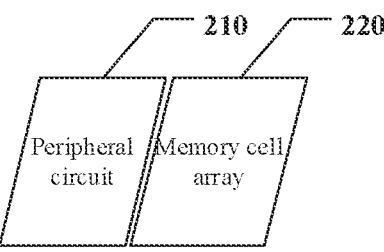
FIG. 5A is a distributional schematic diagram of a memory cell array and a peripheral circuit in an example memory device of an implementation of the present disclosure.
Figure 5B:
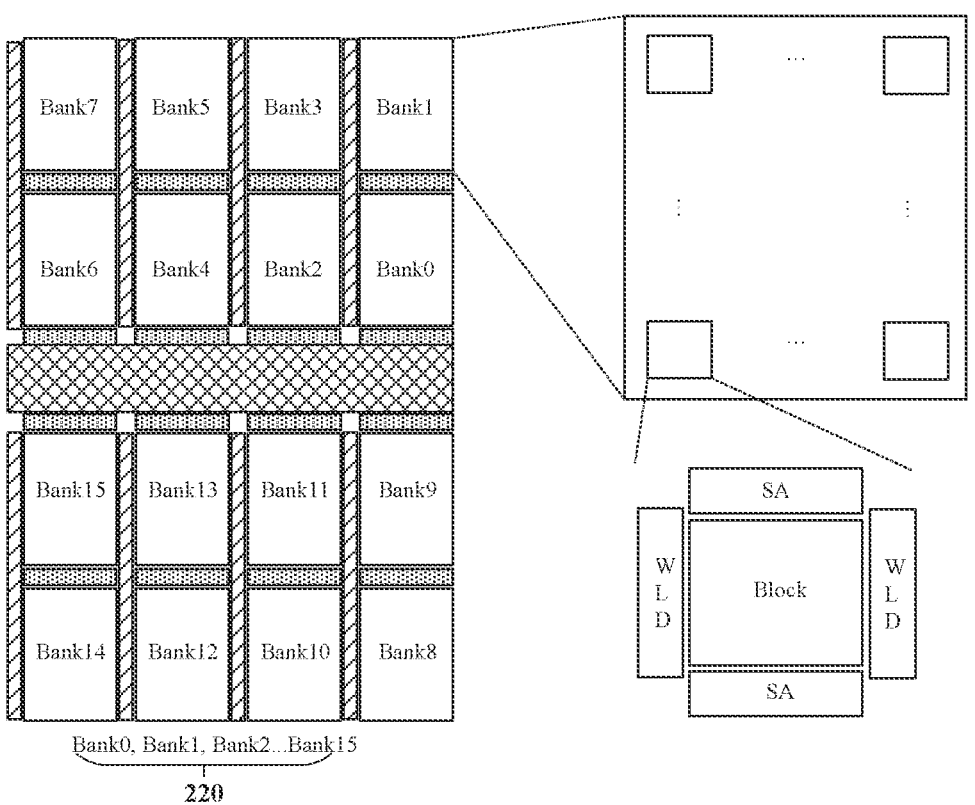
FIG. 5B is a distributional top view of the memory cell array and the peripheral circuit in the example memory device of an implementation of the present disclosure.
Figure 5C:
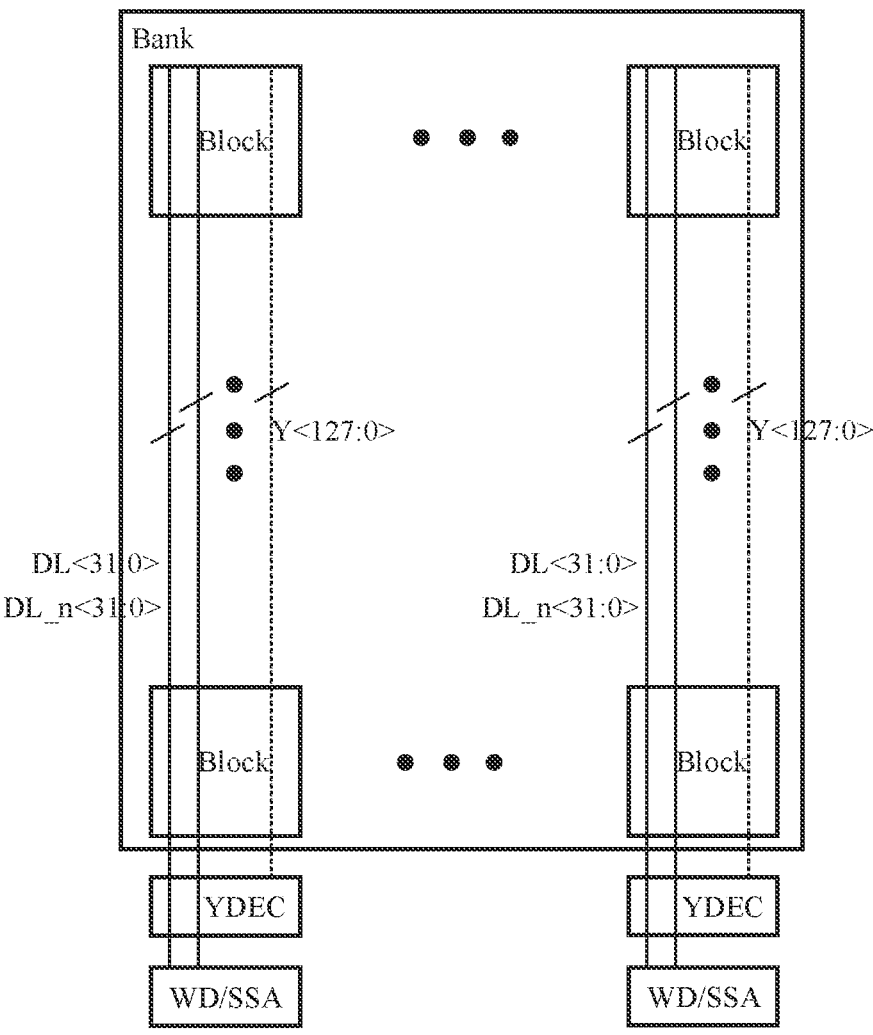
FIG. 5C is a distributional top view of blocks and column decoding circuits in an example bank of an implementation of the present disclosure.

FIG. 5A is a distributional diagram of a memory cell array and a peripheral circuit in an example memory device of an implementation of the present disclosure. FIG. 5B is a distributional top view of the memory cell array and the peripheral circuit in the example memory device of an implementation of the present disclosure. FIG. 5C is a distributional top view of blocks and column decoding circuits in an example bank of an implementation of the present disclosure.

As shown in FIG. 5A, the memory cell array 220 and the peripheral circuit 210 are disposed in juxtaposition. In an example, the memory cell array comprises M banks, each bank comprises N blocks, a control circuit corresponding to each block is disposed on at least one side of the block, and a control circuit corresponding to each bank is disposed on at least one side of the bank. Each K banks of the M banks form a bank row, the M banks form M/K bank rows, and a peripheral circuit corresponding to all the banks are disposed between two intermediate bank rows. It is to be noted that M, N, and K here are all positive integers, and M is an integer multiple of K.

In an example, as shown in FIG. 5B, the memory cell array 220 comprises 16 banks Bank0-Bank15, each bank comprises a plurality of blocks, an SA and a WLD corresponding to each block are disposed oppositely around the block, and a column decoding circuit and a row decoding circuit corresponding to each bank are disposed on two sides of the bank. Each four banks form a bank row, the 16 banks form four bank rows, and a control circuit corresponding to all the banks are disposed between two intermediate bank rows. It is to be noted that a number of the banks and a positional relationship of circuits in FIG. 5B are only used as implementations and are not used to limit a number of banks and a positional relationship of circuits in a memory of the present disclosure.

As shown in FIG. 5C, each bank Bank comprises multiple rows of blocks Block and multiple columns of blocks Block, and each column of blocks corresponds to one column decoding circuit (corresponding to YDEC in FIG. 5C), which is configured to receive a column address signal, perform direct decoding or one-stage decoding on the column address signal, and output a column select signal indicative of enabling a respective bit line in a selected block. The column decoding circuit is disposed on a side of the respective column of blocks and connected with each block in the respective column through column address transmission lines. For example, if one column comprises a plurality of blocks each being selected integrally and comprising 64 bit lines, the column decoding circuit needs to be coupled with the 64 bit lines of each block in the respective column respectively through 64 column address transmission lines. If one column comprises a plurality of blocks each being selected by subblocks (e.g., left and right blocks) respectively, with each subblock comprising 64 bit lines, the column decoding circuit needs to be coupled with 64 bit lines of the left and right blocks of each block in the respective column respectively through 128 column address transmission lines (Y128:0> in FIG. 5C shows a case of 128 column address lines). The column address transmission lines here span the entire column of blocks, with a long span domain, and thus are also referred to as long column address transmission lines.

Meanwhile, data is likewise required to be connected with each block in one column through data transmission lines, as shown in FIG. 5C, wherein the data is connected each block in the column through data transmission line pairs DL<31:0>/DL_n<31:0>, that is, 64 data transmission lines. It may be understood that, in a current case of increasingly high storage density requirements, an area of the memory cell array is relatively small, and an area of each column of blocks is also very small. If each column of blocks is required to be connected with a large number of address transmission and data transmission lines, as shown in FIG. 5C where each column of blocks are required to be connected with 128 column address transmission lines and 64 data transmission lines, with consideration of the necessity to dispose a structure for preventing crosstalk between the transmission lines, then it is very difficult to lay out the column address transmission lines and the data transmission lines in the same metal layer (or wiring layer). For example, the column address transmission lines are disposed in a fourth metal layer, while the data transmission lines are disposed in a fifth metal layer (solid lines and dashed lines are used in FIG. 5C to illustrate that the column address transmission lines and the data transmission lines are not in the same metal layer). When the column address transmission lines and the data transmission lines are not disposed in the same metal layer, a delay mismatch between the column address signal and a data signal may be caused, as well as a large deviation under a Process Voltage Temperature (PVT). In some implementations, trim bits, such as a compensation circuit, may be added for improvement, but a mismatch is still present between circuit and wiring delays.

On that basis, in various implementations of the present disclosure, the column decoding circuit is improved from one-stage decoding to multiple-stage decoding so as to reduce a total number of the column address transmission lines, and area saving is achieved through reasonable disposing of positions of decoders in various stages.

Implementations of the present disclosure provide a memory device, comprising: a memory cell array and a peripheral circuit coupled with the memory cell array, wherein: the memory cell array comprises at least one block, and the block is provided with multiple rows of word lines, multiple columns of bit lines, and memory cells coupled between the word lines and the bit lines; the peripheral circuit comprises a column decoding circuit; the column decoding circuit is coupled with the multiple columns of bit lines and configured to receive a column address signal, perform multi-stage decoding on the column address signal, and output a column select signal indicative of enabling a respective bit line in the block.

In some implementations, the memory device may be understood with reference to the above memory device in FIG. 1, and in some implementations, the memory device 20 is a dynamic random access memory. All the descriptions below are performed with the memory device 20 being a DRAM as an example. An example compositional structure of the DRAM may be understood with reference to a compositional structure of the above DRAM shown in FIG. 3.

In some implementations, the column decoding circuit (which may be also referred to as a column decoder) is coupled with a bit line in the memory cell array through a sensing amplifier (which may be also referred to as a sensing amplification circuit). The column decoding circuit may comprise multiple stages of decoding circuits, which accomplish a task of decoding the column address signal jointly, i.e., instructing to enable a respective bit line in the block. The multiple stages here may include two, three, or more stages. In some implementations, the column decoding circuit comprises two stages of decoding circuits.

It may be understood that the two stages of decoding circuits may function to reduce the number of column address transmission lines without adding excessive circuits that cause a burden of an excessive area increase.

In some implementations, the column decoding circuit comprises: a first stage column decoding circuit comprising a first input interface and a first output interface, wherein the first input interface at least receives the column address signal, the first output interface outputs a preliminary column decoded signal, and a number of transmission lines corresponding to the column address signal is less than a number of transmission lines corresponding to the preliminary column decoded signal; and a second stage column decoding circuit comprising a second input interface and a second output interface, wherein the second input interface is coupled with the first stage column decoding circuit and receives the preliminary column decoded signal, the second output interface is coupled with a plurality of bit lines in the block and outputs a column decoded signal indicative of enabling one of the plurality of bit lines in the block, and the number of the transmission lines corresponding to the preliminary column decoded signal is less than a number of transmission lines corresponding to the column decoded signal.

In some implementations, the first stage column decoding circuit and the second stage column decoding circuit are cascaded in series, the first output interface of the first stage column decoding circuit is coupled with the second input interface of the second stage column decoding circuit, and the second output interface of the second stage column decoding circuit is coupled with a plurality of bit lines in the block. Each column of blocks of each bank in the memory device corresponds to one column decoding circuit, and each column decoding circuit comprises one first stage decoding circuit and one or more second stage column decoding circuits. In some implementations, a number of the second stage column decoding circuits contained in each column decoding circuit is the same as a number of blocks contained in one column of blocks in the bank. In an example, the number of blocks contained in one column of blocks in the bank is 64, the number of the second stage column decoding circuits contained in each column decoding circuit is also 64, and the second stage column decoding circuits are in one-to-one correspondence with the blocks in one column of blocks.

In some implementations, the memory cell array comprises a plurality of banks, each comprising several rows of blocks and several columns of blocks; each of the banks corresponds to a plurality of first stage column decoding circuits and a plurality of second stage column decoding circuits, each of the first stage column decoding circuits corresponds to one column of blocks, and each of the second stage column decoding circuits corresponds to one block of one column of blocks; the second input interface of each of the second stage column decoding circuits is coupled with the first stage column decoding circuit, the second output interface is coupled with a plurality of bit lines of one of the blocks, and the column decoded signal is indicative of enabling a respective bit line in a selected block.

In some implementations, the first output interface of the first stage column decoding circuit is required to be coupled with second input interfaces of all the second stage column decoding circuits, and the second stage column decoding circuits are disposed as being corresponding to the blocks which are disposed next to the second stage column decoding circuits. As such, first address transmission lines between the first output interface of the first stage column decoding circuit and the second input interfaces of all the second stage column decoding circuits span the entire column of blocks, with a long span domain having a length similar to that of the above long column address transmission lines.

It is to be noted that a number of the first address transmission lines is required to represent each bit line into the block. If a number of the bit lines in each block is M, and an address signal on each address transmission line may be a high logic level "1" or a low logic level "0", it can be seen from 2N=M that, the M bit lines may be represented by at least N address transmission lines, and M and N here are both positive integers. For example, if each block is selected integrally and comprises 64 bit lines, then the number of the first address transmission lines is 16; if each block is selected by subblocks (e.g., left and right blocks) respectively, with each subblock comprising 64 bit lines, then the number of the first address transmission lines is 24. It can be seen that, compared with the above case of 64 or 128 long column address transmission lines, the case of 16 or 24 first address transmission lines in this example greatly reduces the number of the lines, which is favorable to area saving, so that all the column address transmission lines corresponding to one column of blocks and data transmission lines are laid out in the same metal layer.

In some implementations, the second output interface of the second stage column decoding circuit is required to be coupled with all the bit lines in one block, so a number of second address transmission lines between the second output interface of each second stage column decoding circuit and each bit line in the block is related to the number of the bit lines in each block. For example, if each block is selected integrally and comprises 64 bit lines, then the number of the second address transmission lines is 64; if each block is selected by subblocks (e.g., left and right blocks) respectively, with each subblock comprising 64 bit lines, then the number of the second address transmission lines is 128.

It is to be noted that, since the second stage column decoding circuits are disposed as being corresponding to the blocks which are disposed next to the second stage column decoding circuits, the second address transmission lines do not span a long length, and the second address transmission lines here do not belong to the same concept as the above long address transmission lines.

In some implementations, each first stage column decoding circuit is disposed on a side of the respective column of blocks. The first stage column decoding circuit may be disposed on the side of the respective column of blocks along an extension direction of the column of blocks.

The second stage column decoding circuit is required to be disposed in the vicinity of the block corresponding thereto, and a position of the second stage column decoding circuit may be disposed in various ways, two implementations of which are given below.

Figure 6A:
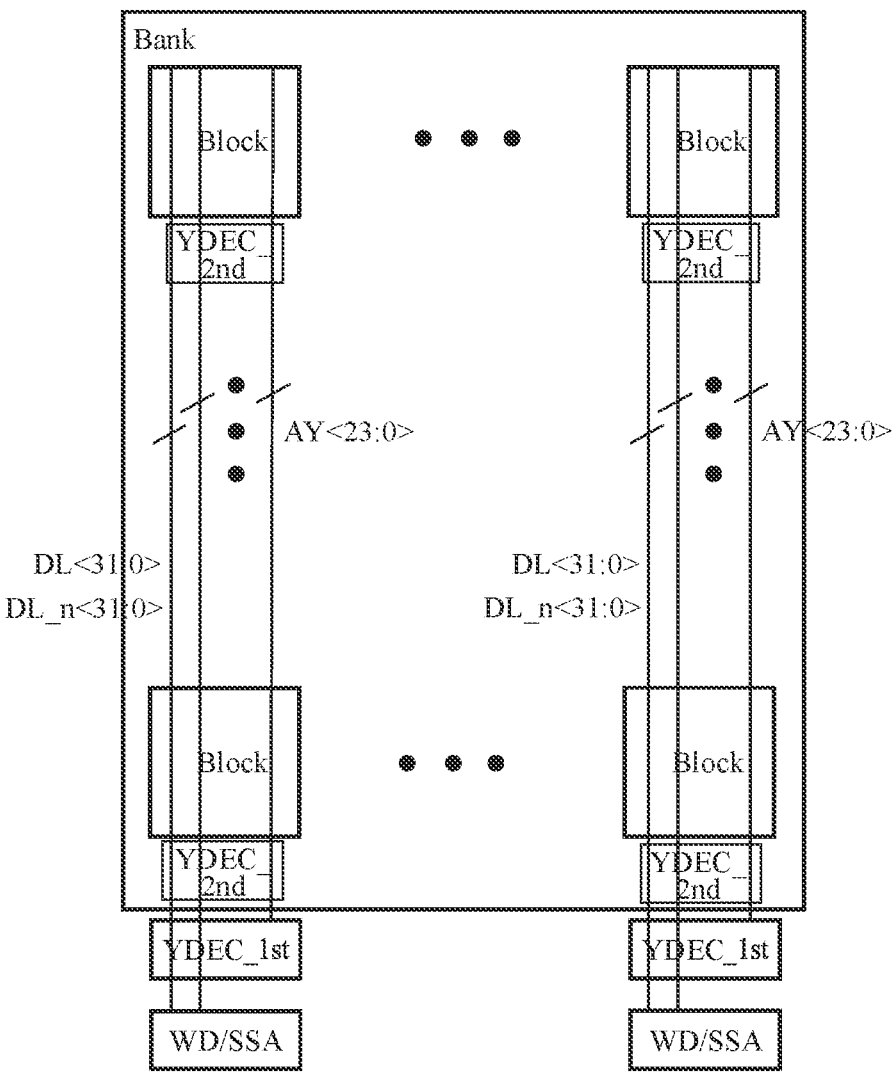
FIG. 6A is a distributional top view of blocks and column decoding circuits in an example bank of another example of the present disclosure.

In some implementations, as shown in FIG. 6A, the first stage column decoding circuit (corresponding to YDEC_1st in FIG. 6A) of each column of blocks is disposed on a side of the respective column of blocks; the second stage column decoding circuit (corresponding to YDEC_2nd in FIG. 6A) is disposed on a side of the respective block in juxtaposition, and in order to facilitate wiring, may be disposed on a side of the block where a sensing amplifier (SA) is disposed. Considering, for example, that SAs may be disposed on two sides of one block as shown in FIG. 5B, a design of dividing each second stage column decoding circuit into two parts to match the SAs may also be considered when the second stage column decoding circuit is disposed (this case is not shown in FIG. 6A).

For the case where the second stage column decoding circuit is disposed in juxtaposition with the respective block, an overall structure of the corresponding memory device may be referred to the above structures shown in FIGS. 5A and 5B.

Figure 6B:
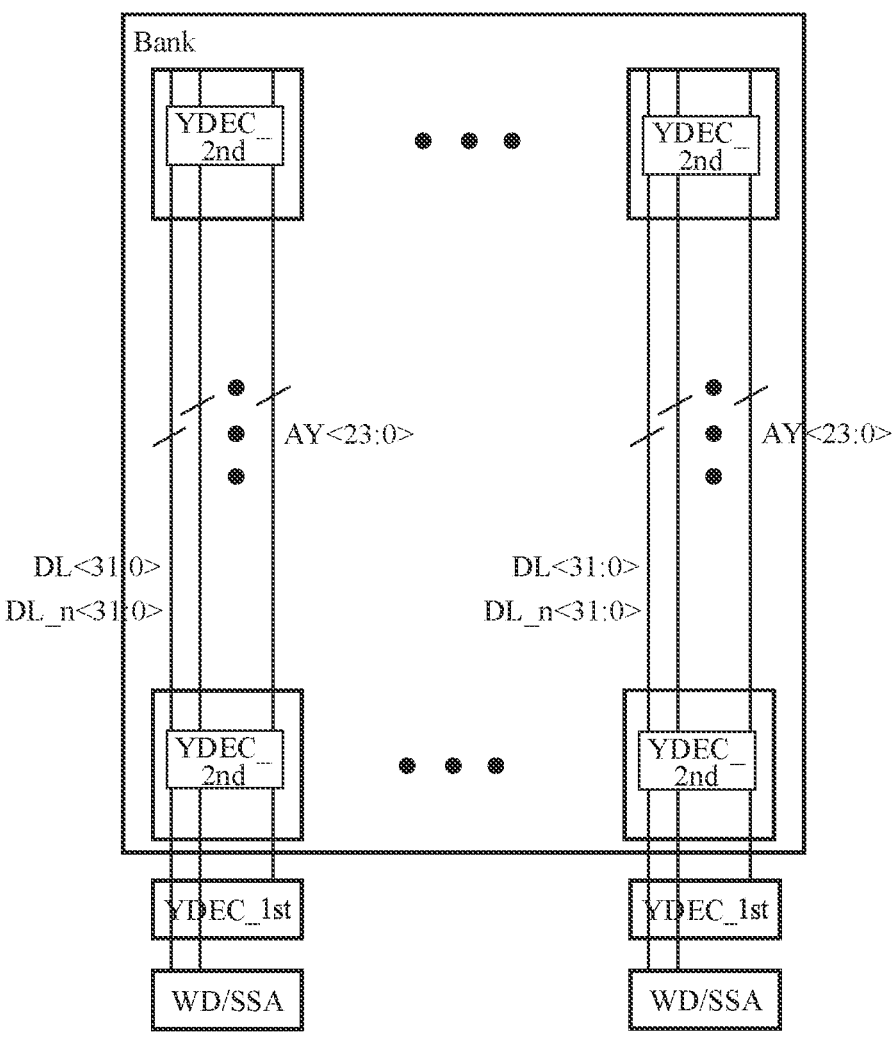
FIG. 6B is a distributional top view of blocks and column decoding circuits in an example bank of still another example of the present disclosure.

In some other implementations, as shown in FIG. 6B, the first stage column decoding circuit (corresponding to YDEC_1st in FIG. 6B) of each column of blocks is disposed on a side of the respective column of blocks; the second stage column decoding circuit (corresponding to YDEC_2nd in FIG. 6B) and the respective block are disposed as being stacked. In an example, the second stage column decoding circuit may be located on the respective block, or the block may be located on the respective second stage column decoding circuit.

It is to be noted that FIGS. 6A and 6B are only illustrations of relative orientations of the second stage column decoding circuit with respect to the respective block, and are not intended to limit an example disposed position of the second stage column decoding circuit.

In some implementations, the memory comprises a plurality of address transmission lines and a plurality of data transmission lines; the first stage column decoding circuit corresponding to one column of blocks is connected with a second stage column decoding circuit corresponding to each block in the one column of blocks through the plurality of address transmission lines; each block in the one column of blocks are connected with the data transmission lines; the plurality of address transmission lines and the plurality of data transmission lines are disposed in the same metal layer.

As described above, the first address transmission lines between the first output interface of each first stage column decoding circuit and the second input interfaces of all the second stage column decoding circuits are reduced greatly, compared with the above long column address transmission lines. As shown in FIG. 6A or FIG. 6B, the first address transmission lines between the first output interface of each first stage column decoding circuit and the second input interfaces of all the second stage column decoding circuits are reduced from 128 lines as shown in FIG. 5C to 24 lines AY<23:0>, which can be disposed in the same metal layer with the 64 data transmission lines DL<31:0>/DL_n<31:0>. In an example, the first address transmission lines and the data transmission lines are all disposed in the fifth metal layer. The AY<23:0> and DL<31:0>/DL_n<31:0> in FIG. 6A and FIG. 6B are all denoted using solid lines to indicate that they are both located in the same metal layer. It may be understood that, when the address transmission lines and the data transmission lines are laid out in the same metal layer, the problem of inner-block asynchronization between the column address signal and the data signal may be improved, and the impact of the PVT is reduced with the addition of the compensation circuit.

For the case where the second stage column decoding circuit and the respective block are disposed as being stacked, respective adjustment to an overall structure layout of the memory device is required.

In some implementations, the memory cell array is disposed on a first semiconductor structure, and the peripheral circuit is disposed on a second semiconductor structure; the first semiconductor structure and the second semiconductor structure are disposed as being stacked and are electrically connected by means of bonding; each of the first stage column decoding circuits is disposed on a side of the respective column of blocks; each of the second stage column decoding circuits, as well as a sensing amplifier and a word-line driver corresponding to each block, is disposed at a position of an orthographic projection of one respective block on a plane where the second semiconductor structure is located.

Figure 7A:
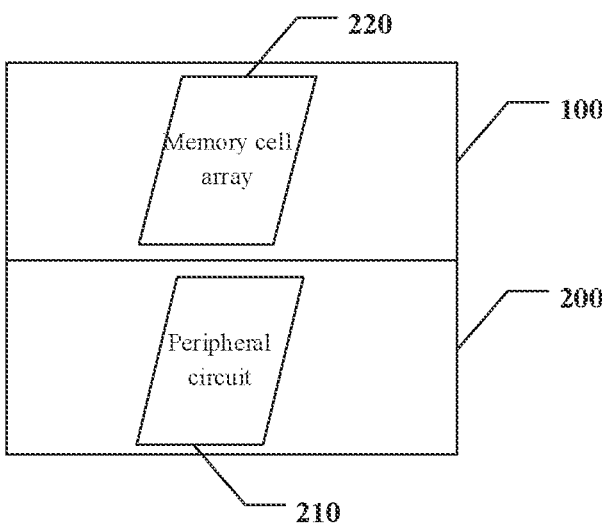
FIG. 7A is a distributional schematic diagram of a memory cell array and a peripheral circuit in an example memory device of another example of the present disclosure.
Figure 7B:
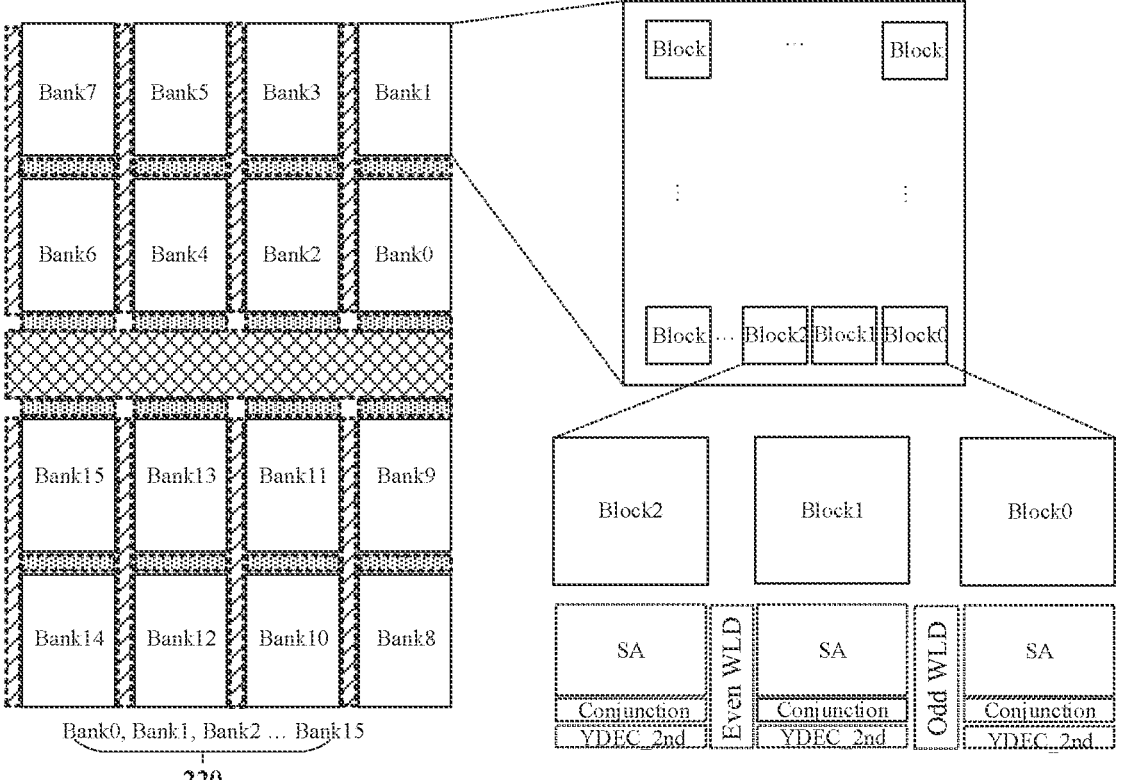
FIG. 7B is a distributional top view of the memory cell array and the peripheral circuit in the example memory device of another example of the present disclosure.

FIG. 7A is a distributional schematic diagram of a memory cell array and a peripheral circuit in an example memory of another example of the present disclosure. FIG. 7B is a distributional top view of the memory cell array and the peripheral circuit in the example memory of another example of the present disclosure.

As shown in FIG. 7A, the first semiconductor structure 100 is disposed above the second semiconductor structure 200. The first semiconductor structure 100 comprises a memory cell array 220, and the second semiconductor structure 200 comprises a peripheral circuit 210.

It is to be noted that, the first semiconductor structure in FIG. 7B corresponding to FIG. 7A is located above the second semiconductor structure, and in FIG. 7B, a structure corresponding to a solid line is a structure located in the first semiconductor structure and a structure corresponding to a dashed line is a structure located in the second semiconductor structure. In order to facilitate understanding, a perspective view of the structure in the second semiconductor structure is provided. That is, in an enlarged view corresponding to each block Block in FIG. 7B, the solid line represents an enlarged portion of the block Block, and a dashed line represents the structure in the second semiconductor structure at a position directly below the block Block.

In an example, as shown in FIG. 7B, the memory cell array 220 comprises 16 banks Bank0-Bank15, and each bank comprises a plurality of blocks. A sensing amplifier (SA), a second stage column decoding circuit YDEC_2nd, and a conjunction circuit Conjunction between the sensing amplifier (SA) and the second stage column decoding circuit YDEC_2nd are disposed directly below each block. A word-line driver is disposed directly below a gap between two adjacent blocks along an extension direction of a row of blocks. In some implementations, the word-line driver may comprise an odd word-line driver Odd WLD and an even word-line driver Even WLD, which are disposed on two sides of the block respectively.

It is to be noted that positions of the sensing amplifier (SA), the second stage column decoding circuit YDEC_2nd, the conjunction circuit Conjunction, the odd word-line driver Odd WLD, and the even word-line driver Even WLD in FIG. 7B are only intended for illustration, rather than limiting the positions of respective circuits in the memory of the present disclosure.

In some implementations, means of bonding the memory cell array 220 to the peripheral circuit 210 include, but are not limited to, hybrid bonding, anode bonding, fusion bonding, transfer bonding, adhesive bonding, and eutectic bonding, etc.

When the memory device adopts a stacked arrangement by bonding, circuits added in the implementations of the present disclosure, e.g., a second stage address decoding circuit and circuits related to the SA and the WLD etc., may be placed below the memory cell array. Due to the stacked arrangement, the added circuits bring no extra area costs.

An example circuit implementation of each of the two stages of decoding circuits is described in detail below.

In some implementations, the column address signal comprises multiple bits of data; the first stage column decoding circuit 231 comprises: a first decoding circuit 2311 configured to perform decoding processing on multiple consecutive low-order bits of data in the column address signal to obtain a first decoded signal; and a second decoding circuit 2312 configured to perform decoding processing on remaining multiple consecutive high-order bits of data in the column address signal to obtain a second decoded signal; the first decoded signal and the second decoded signal are configured to form the preliminary column decoded signal jointly.

In some implementations, the column address signal is a signal representing column address information. In some implementations, the column address signal is multi-bit binary data, and a number of bits of the column address signal is related to the number of the bit lines contained in the block. If the number of the bit lines in each block is M, and the column address signal is N-bit binary data, then $2N=M$. In an example, if each block comprises 64 bit lines, the column address signal may be 6-bit binary data.

Figure 8A:
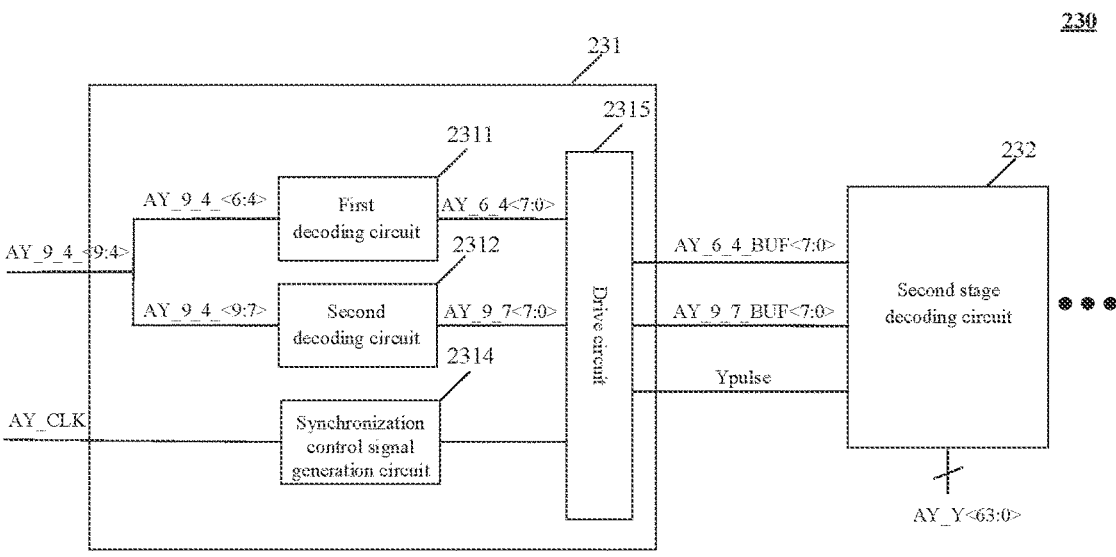
FIG. 8A is a compositional block diagram of an example column decoding circuit of an implementation of the present disclosure.

Considering that the number of the bit lines is generally large and one decoding circuit may be insufficient, here the first decoding circuit 2311 and the second decoding circuit 2312 are used to decode different parts of consecutive data bits in the column address signal respectively, and then two decoded signals jointly form an output of the first stage decoding circuit 231. In a example, the first decoding circuit 2311 and the second decoding circuit 2312 are responsible for decoding the same number of data bits. In an example, as shown in FIG. 8A, the column address signal AY_9_4_<9:4> is 6-bit binary data, the first decoding circuit 2311 decodes three low-order bits AY 9_4<6:4> in the column address signal, and the second decoding circuit 2312 decodes three high-order bits AY 9_4<9:7> in the column address signal.

In some implementations, the first decoding circuit 2311 and the second decoding circuit 2312 each may comprise one or more decoders, e.g., a 2-to-4 decoder, and a 3-to-8 decoder. In some implementations, the first decoding circuit 2311 and the second decoding circuit 2312 each may comprise one or more 3-to-8 decoders. decoding of different numbers of data bits may be achieved using combinations of different numbers of 3-to-8 decoders.

Figure 8B:
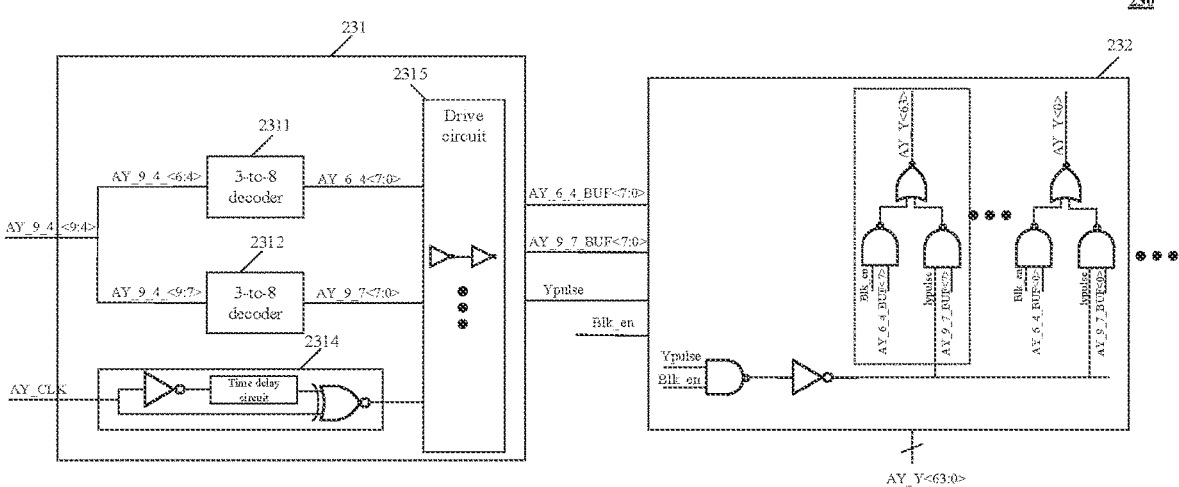
FIG. 8B is a schematic diagram of an example implementing circuit of the example column decoding circuit of an implementation of the present disclosure.

In an example, as shown in FIG. 8B, the column address signal is 6-bit binary data, the first decoding circuit 2311 and the second decoding circuit 2312 each comprise one 3-to-8 decoder, and two 3-to-8 decoders may achieve 6-to-16 bit decoding.

In an example, the column address signal is 12-bit binary data, the first decoding circuit 2311 and the second decoding circuit 2312 each comprise two 3-to-8 decoders, every two 3-to-8 decoders exactly achieve 6-to-16 bit decoding, and four 3-to-8 decoders may achieve 12-to-32 bit decoding.

In an example, the column address signal is 4-bit binary data, the first decoding circuit 2311 and the second decoding circuit 2312 each comprise one 3-to-8 decoder, two 3-to-8 decoders respectively decode 2 of the 4 bits into 4 bits (discarding some bits) to achieve 4-to-8 bit decoding. Furthermore, the first decoding circuit 2311 and the second decoding circuit 2312 may each comprise one 2-to-4 decoder, and two 2-to-4 decoders may achieve 4-to-8 bit decoding.

In some implementations, the first stage column decoding circuit 231 further comprises: a synchronization control signal generation circuit 2314 configured to generate a synchronization control signal corresponding to a clock period less than a clock period corresponding to the first decoded signal and the second decoded signal; the second input interface of the second stage column decoding circuit 232 further receives the synchronization control signal, and the second stage column decoding circuit 232 is configured to output the column decoded signal in response to an enabled state of the synchronization control signal and normal output of the first decoded signal and the second decoded signal.

In order to synchronize timings of the first stage column decoding circuit 231 and the second stage decoding circuit, as in FIG. 8A, the synchronization control signal generation circuit 2314 is disposed to perform a timing constraint. A clock period corresponding to the synchronization control signal is less than a clock period corresponding to the first decoded signal and the second decoded signal. In some implementations, the clock period corresponding to the synchronization control signal is half of the clock period corresponding to the first decoded signal and the second decoded signal.

Figure 8C:
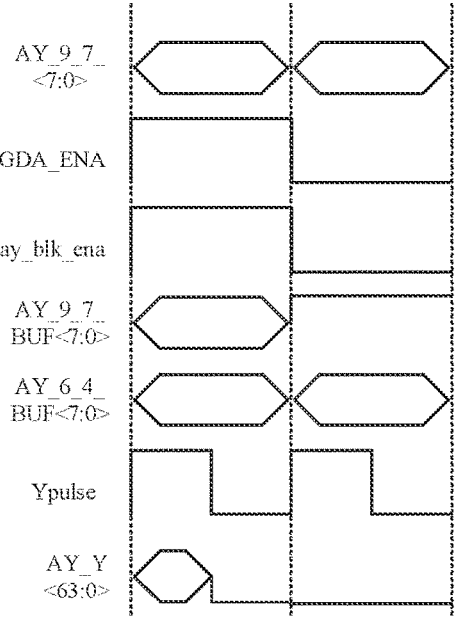
FIG. 8C is a schematic diagram of voltage timings of part of signals in the example column decoding circuit of an implementation of the present disclosure.

In an example, as shown in FIG. 8B, the synchronization control signal generation circuit 2314 may be a square signal generation circuit, and a waveform of the synchronization control signal may be referred to Ypulse shown in FIG. 8C. FIG. 8B further provides a schematic diagram of the synchronization control signal generation circuit 2341. As shown in FIG. 8B, the synchronization control signal generation circuit 2341 may comprise an inverter, a time delay circuit, and an exclusive OR gate. An input end of the inverter receives a clock signal AY_CLK, and a clock period of the clock signal here may be the same as the clock period corresponding to the first decoded signal and the second decoded signal. An output end of the inverter is connected with an input end of the time delay circuit, and the time delay circuit is configured to perform time delay processing on the clock signal, e.g., a time delay of half a cycle. A first input end of the exclusive OR gate is connected with an output end of the time delay circuit, a second input end of the exclusive OR gate receives the clock signal, and an output end of the exclusive OR gate outputs the synchronization control signal.

As shown in FIG. 8C, the period of preliminary column decoded signals AY_6_4_BUF<7:0> and AY_9_7_BUF<7:0> is narrowed under the action of the synchronization control signal Ypulse, so that the period of the column decoded signal AY_Y<63:0> and the period of the synchronization control signal Ypulse are consistently narrowed to be half of the period of the preliminary column decoded signals AY_6_4_BUF<7:0> and AY_9_7_BUF<7:0>. That is, the synchronization control signal acts as a timing constraint.

It is to be noted that FIG. 8B only provides an implementation of the synchronization control signal generation circuit, which is not intended to limit an example circuit of the synchronization control signal generation circuit in the implementations of the present disclosure.

It may be understood that the column decoding circuit comprises the first stage column decoding circuit and the second stage column decoding circuit. The second stage column decoding circuit adds a synchronization control operation. The consistency of a column address and a data timing in the block is favorable to timing coordination during high-speed working.

In some implementations, the second stage column decoding circuit 232 is configured to receive the synchronization control signal and a semiconductor element enable signal and, when the synchronization control signal and a block enable signal are both enabled, output the column decoded signal to enable a bit line in a selected block corresponding to an enabled data bit of the preliminary column decoded signal; and the block enable signal being enabled represents that the block is selected.

In some implementations, the second stage column decoding circuit 232 is configured to receive the first decoded signal, the second decoded signal, the synchronization control signal, and the block enable signal, and perform operations on the first decoded signal, the second decoded signal, the synchronization control signal, and the block enable signal to obtain the decoded signal. For a bit line in the block, when a signal on a respective bit of the first decoded signal and a signal on a respective bit of the second decoded signal that are corresponding to the bit line are both in an enabled state, and the synchronization control signal and the block enable signal are also both in an enabled state, a decoded signal corresponding to the bit line is in an enabled state, and at this time, decoded signals corresponding to the other bit lines are in a disabled state. It is to be noted that the enabled state and the disabled state of the decoded signal mentioned here may be understood as the signal being at a certain logic level indicative of activation or inactivation of a certain bit line.

An example compositional circuit of the second stage column decoding circuit 232 may be referred to FIG. 8B. It is to be noted that, FIG. 8B only shows one second stage column decoding circuit 232. As stated above, each block corresponds to one second stage column decoding circuit 232, and each second stage column decoding circuit is connected with an output of the first stage column decoding circuit. Different blocks correspond to different block enable signals. For example, the block enable signal corresponding to the selected block is at a high logic level "1", and a block enable signal corresponding to an unselected block is at a ground logic level "0".

As shown in FIG. 8B, the second stage column decoding circuit 232 comprises circuits, each as shown in a dashed line box, of a number the same as the number of the bit lines. The circuit as shown in the dashed line box comprises one NOR gate and two NAND gates. A first input end of one of the NAND gates receives the block enable signal, and a second input end receives a signal on a data bit of the first decoded signal in the preliminary column decoded signal corresponding to the bit line. A first input end of the other one of the NAND gates receives a synchronization control operation signal lypulse corresponding to the synchronization control signal (In some implementations, the synchronization control operation signal lypulse is obtained by performing an AND operation on the synchronization control signal Ypulse and the block enable signal Blk_en), and a second input end receives a signal on a data bit of the second decoded signal in the preliminary column decoded signal corresponding to the bit line. Output ends of the two NAND gates are connected to input ends of the NOR gate, and an output end of the NOR gate outputs the column decoded signal. Each data bit of the column decoded signal corresponds to one bit line.

It is to be noted that, in the implementations of the present disclosure, each second stage column decoding circuit 232 comprises circuits, each as shown in the dashed line box, of a number the same as the number of the bit lines. An input end of the circuit as shown in the dashed line box respectively receives a combined signal of any data bit included in the first decoded signal and any data bit included in the second decoded signal. In an example, the first decoded signal comprises 8 bits of data, and the second decoded signal comprises 8 bits of data. Then there are 64 circuits each as shown in the dashed line box, and an input of each circuit as shown in the dashed line box is a combination of any data bit of the 8 bits of data included in the first decoded signal and any data bit of the 8 bits of data included in the second decoded signal.

It is to be noted that FIG. 8B only provides an implementation of the second stage column decoding circuit 232, which is not intended to limit an example circuit of the second stage column decoding circuit 232 in the implementations of the present disclosure.

In some implementations, the first stage column decoding circuit 231 further comprises: a drive circuit 2315 comprising a plurality of drivers; each driver is connected with one of a plurality of transmission lines corresponding to the first decoded signal and the second decoded signal respectively, and is configured to perform power amplification processing on a decoded signal on a respective transmission line.

In some implementations as shown in FIG. 8A, a driver may be disposed on each transmission line. Each transmission line may comprise the above first address transmission lines between the first output interface of each first stage column decoding circuit 231 and the second input interfaces of all the second stage column decoding circuits, and may further comprise a transmission line of the synchronization control signal generated by the synchronization control signal generation circuit 2314.

In some implementations as shown in 8B, the driver may comprise an even number of inverters cascaded in series, and an example number may be two, four, or more. The driver may be configured to increase transmit power, so as to avoid or improve the problem of a transmission failure due to an excessively long transmission line and an excessive power loss.

It may be understood that, since the driver 2315 is disposed as being corresponding to each transmission line, in the implementations of the present disclosure, the number of drivers may be also reduced while reducing the address transmission lines, thereby reducing an overall circuit area.

The block in the above column decoding circuit 230 is selected and unselected integrally. In some implementations, the block may be also selected by partitions, or referred to as being selected by blocks. An example implementation of the column decoding circuit 230 in the block selected by partitions is described below.

In some implementations, the block comprises a first region and a second region, and numbers of bit lines disposed in the first region and the second region are the same; the first stage column decoding circuit 231 further comprises: a third decoding circuit 2313, a first region select circuit 2316, and a second region select circuit 2317; the third decoding circuit 2313 is configured to perform decoding processing on the remaining multiple consecutive high-order bits of data in the column address signal to obtain a third decoded signal; the third decoded signal and the second decoded signal are the same; the first region select circuit 2316 is connected with the second decoding circuit 2312 and configured to output the second decoded signal when a first region enable signal is enabled; the second region select circuit 2317 is connected with the third decoding circuit 2313 and configured to output the third decoded signal when a second region enable signal is enabled; the first region enable signal/second region enable signal being enabled represents that the first region/second region of the block is selected.

In some implementations, the first stage column decoding circuit 231 further comprises: a buffer 2318; the buffer 2318 is connected with the first decoding circuit and configured to perform timing adjustment on the first decoded signal for synchronization with output signals of both the first region select circuit and the second region select circuit.

Figure 9A:
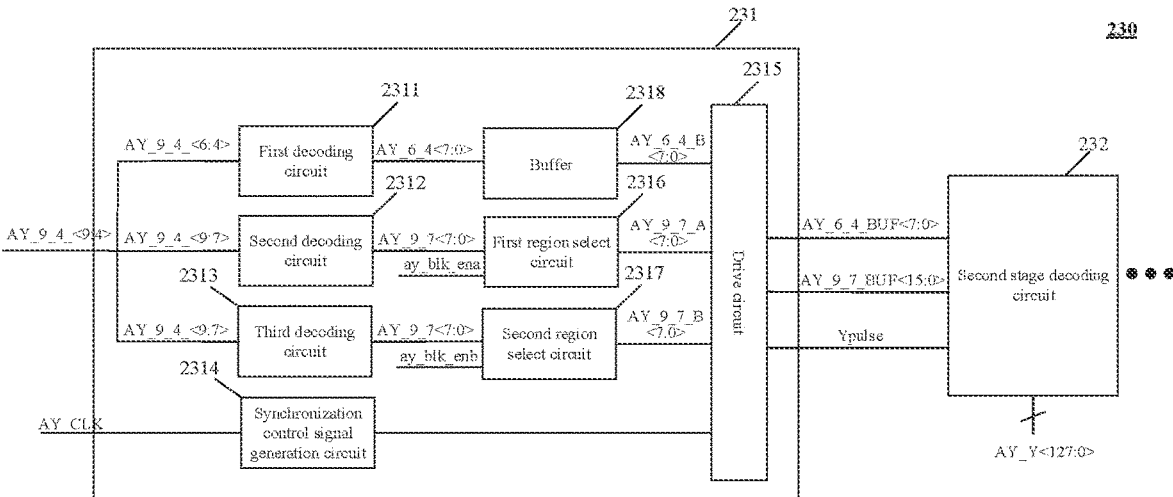
FIG. 9A is a compositional block diagram of an example column decoding circuit of another example of the present disclosure.

In some implementations, as shown in FIG. 9A, the first stage column decoding circuit 231 may further comprise: a third decoding circuit 2313, a first region select circuit 2316, and a second region select circuit 2317, wherein the third decoding circuit 2313 may be a duplicate of the second decoding circuit 2312, i.e., decoding the three high-order bits $AY\_9\_4\_<9:7>$ in the column address signal. An example implementation circuit of the third decoding circuit 2313 may be also understood with reference to the above second decoding circuit 2312.

The first region select circuit 2316 and the second region select circuit 2317 are respectively configured to select a block region. The first region select circuit 2316 is connected with the second decoding circuit 2312 and configured so that when the first region enable signal is in an enabled state, the second decoded signal continues to be transmitted backward through the first region select circuit 2316. When the first region enable signal is in a disabled state, the second decoded signal transmits a fixed logic level, e.g., a signal with data bits all being "0". The second region select circuit 2317 is connected with the third decoding circuit 2313 and configured so that when the second region enable signal is in an enabled state, the third decoded signal continues to be transmitted backward through the second region select circuit 2317. When the second region enable signal is in a disabled state, the third decoded signal transmits a fixed logic level, e.g., a signal with data bits all being "0".

Figure 9B:
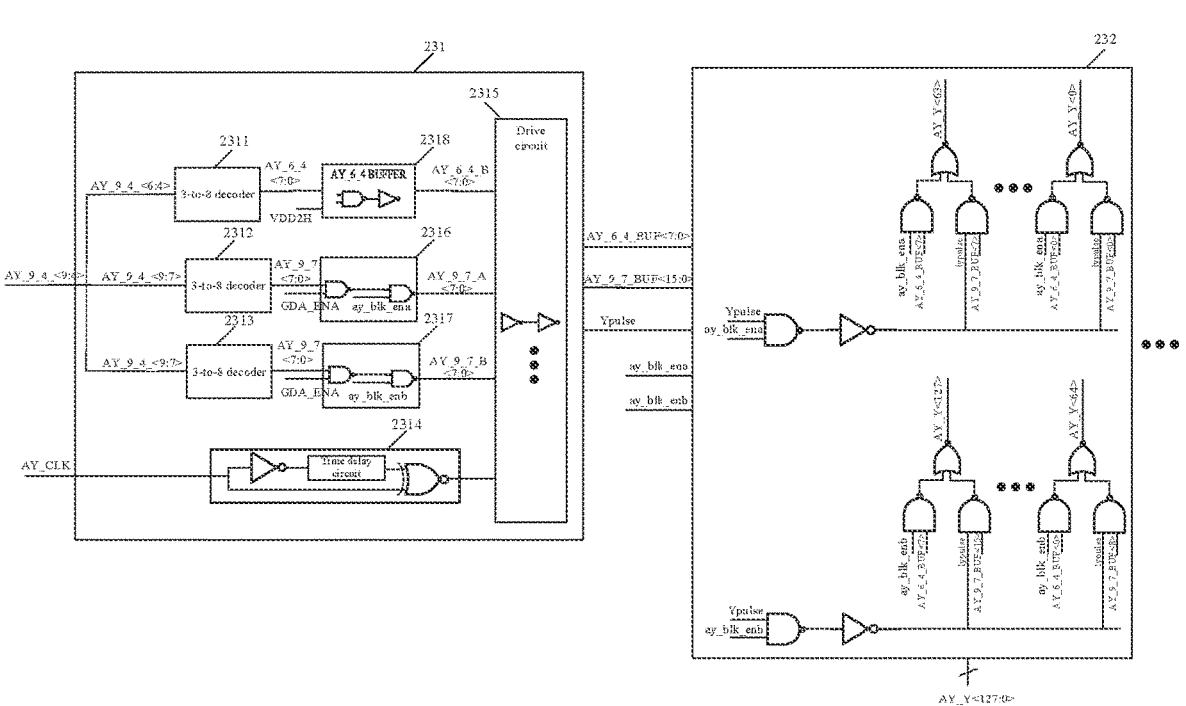
FIG. 9B is a schematic diagram of an example implementing circuit of the example column decoding circuit of another example of the present disclosure.

In some implementations, as shown in FIG. 9B, the first region select circuit 2316 and the second region select circuit 2317 may each comprise two NAND gates that are cascaded in series. A first input end of one of the NAND gates is connected with an output end of the second decoding circuit 2312 or an output end of the third decoding circuit 2313, and a second input end receives a partition enable signal, wherein the partition enable signal being enabled represents that the block supports selection by partitions. A first input end of the other one of the NAND gates is connected with an output end of the previous NAND gate, and a second input end receives a partition enable signal, wherein the partition enable signal being enabled represents that the block supports selection by partitions. An output end of the other one of the NAND gates outputs the second decoded signal or the third decoded signal.

After the addition of the first region select circuit 2316 and the second region select circuit 2317, in order to make a timing of a branch circuit where the first decoding circuit 2311 is located match those of the second decoding circuit 2312 and the third decoding circuit 2313, the addition of the buffer 2318 as shown in FIG. 9A to the branch circuit where the first decoding circuit 2311 is located is required.

In some implementations, as shown in FIG. 9B, the buffer 2318 may comprise a NAND gate and an inverter cascaded in series, wherein a first input end of the NAND gate is connected with an output end of the first decoding circuit 2311, a second input end receives a fixed logic level signal, e.g., VDD2H, i.e., a high logic level "1", and an output end is connected with an input end of the inverter. The input end of the inverter outputs the first decoded signal normally.

It is to be noted that output ends of the buffer 2318, the first region select circuit 2316, and the second region select circuit 2317 may be connected with an input end of the above drive circuit, so as to perform power amplification.

It is to be noted that a respective adjustment to the second stage column decoding circuit 232 is also required. As shown in FIG. 9B, for each partition of the block, a duplicate of the circuit in the dashed line box in FIG. 8B is required, and different partitions correspond to different input signals. In an example, an input end of a circuit shown in a dashed line box corresponding to the first region respectively receives a combined signal of any data bit included in the first decoded signal and any data bit included in the second decoded signal; and an input end of a circuit shown in a dashed line box corresponding to the second region respectively receives a combined signal of any data bit included in the first decoded signal and any data bit included in the third decoded signal.

In an example, the first region of the block comprises 64 bit lines, and the second region of the block comprises 64 bit lines. The column address signal is 6-bit binary data. The preliminary column decoded signal corresponds to 24 transmission lines, wherein the first decoded signal comprises 8 bits of data, the second decoded signal comprises 8 bits of data, and the third decoded signal also comprises 8 bits of data. Then there are 128 circuits each as shown in the dashed line box. An input of the circuit shown in each dashed line box corresponding to the first region is a combination of any data bit in the 8 bits of data included in the first decoded signal and any data bit in the 8 bits of data included in the second decoded signal. An input of the circuit shown in each dashed line box corresponding to the second region is a combination of any data bit in the 8 bits of data included in the first decoded signal and any data bit in the 8 bits of data included in the third decoded signal.

In the implementations of the present disclosure, the column decoding circuit comprises the first stage column decoding circuit and the second stage column decoding circuit. A column address decoding circuit (the second stage column decoding circuit) is added behind the column, so as to transmit a last decoding circuit (the second stage column decoding circuit) of the column address to each block, and synchronization control is added to the second stage column decoding circuit. As such, the decoding circuit provided in the implementations of the present disclosure may significantly reduce the number of the long column address lines, and the same metal layer may be used to transmit both the column address and data. Accordingly, the column address and the data are synchronized in the block, thereby reducing the impact of the PVT and facilitating timing coordination during high-speed working.

Furthermore, when the memory device adopts a stacked arrangement in a bonding way, the circuits added in the implementations of the present disclosure, e.g., the second stage address decoding circuit and circuits related to the SA and the WLD etc., may be placed below the memory cell array. Due to the stacked arrangement of the memory cells and the peripheral circuits, a match of the column address and the data is closer, and the added circuits bring no extra area costs.

Implementations of the present disclosure further provide a memory system, comprising: one or more of the above memory devices provided in the implementations of the present disclosure; and a memory controller coupled with the memory devices and controlling the memory devices.

In some implementations, internal composition of the memory system may be understood with reference to above FIG. 1, and some application scenarios of the memory system may be understood with reference to above FIGS. 2A and 2B, which are not repeated herein.

Implementations of the present disclosure further provide a decoding circuit, comprising: a first stage decoding circuit comprising a first input interface and a first output interface, wherein the first input interface at least receives a signal to be decoded, the first output interface outputs a preliminary decoded signal, and a number of transmission lines corresponding to the signal to be decoded is less than a number of transmission lines corresponding to the preliminary decoded signal; and a second stage decoding circuit comprising a second input interface and a second output interface, wherein the second input interface is coupled with the first stage decoding circuit and receives the preliminary decoded signal, the second output interface is coupled with a plurality of structures to be selected in a semiconductor element and outputs a decoded signal indicative of enabling one structure to be selected in the semiconductor element, and the number of the transmission lines corresponding to the preliminary decoded signal is less than a number of transmission lines corresponding to the decoded signal.

In some implementations, the decoding circuit may not be limited to the column decoding circuit of the above memory, but may be a decoding circuit of other electronic devices. The decoding circuit is configured to perform decoding processing to indicate the enablement of one structure to be selected in the semiconductor element included in the electronic devices.

It is to be noted that, the first stage decoding circuit here may be understood with reference to the above first stage column decoding circuit, the second stage decoding circuit here may be understood with reference to the above second stage column decoding circuit, and the signal to be decoded may be understood with reference to the above column address signal; the semiconductor element may be understood with reference to the above block, and the structures to be selected may be understood with reference to the above bit lines.

In some implementations, there are a plurality of second stage decoding circuits, each corresponding to one semiconductor element; the second input interface of each of the second stage decoding circuits is coupled with the first stage decoding circuit, the second output interface is coupled with a plurality of structures to be decoded of one semiconductor element, and the decoded signal is indicative of enabling a respective structure to be decoded in a selected semiconductor element.

In some implementations, the signal to be decoded comprises multiple bits of data; the first stage decoding circuit comprises: a first decoding circuit configured to perform decoding processing on multiple consecutive low-order bits of data in the signal to be decoded, so as to obtain a first decoded signal; and a second decoding circuit configured to perform decoding processing on remaining multiple consecutive high-order bits of data in the signal to be decoded, so as to obtain a second decoded signal; the first decoded signal and the second decoded signal are configured to form the preliminary decoded signal jointly.

In some implementations, the first stage decoding circuit further comprises: a synchronization control signal generation circuit configured to generate a synchronization control signal corresponding to a clock period less than a clock period corresponding to the first decoded signal and the second decoded signal; the second input interface of the second stage decoding circuit further receives the synchronization control signal, and the second stage decoding circuit is configured to output the decoded signal in response to an enabled state of the synchronization control signal and normal output of the first decoded signal and the second decoded signal.

In some implementations, the second stage decoding circuit is configured to receive the synchronization control signal and a semiconductor element enable signal and, when the synchronization control signal and the semiconductor element enable signal are both enabled, output the decoded signal to enable a structure to be selected in a selected semiconductor element corresponding to an enabled data bit of the preliminary decoded signal; and the semiconductor element enable signal being enabled represents that the semiconductor element is selected.

In some implementations, the first stage decoding circuit further comprises: a drive circuit comprising a plurality of drivers; each driver is connected with one of a plurality of transmission lines corresponding to the first decoded signal and the second decoded signal respectively, and is configured to perform power amplification processing on a decoded signal on a respective transmission line.

In some implementations, the first stage decoding circuit further comprises: a third decoding circuit, a first region select circuit, and a second region select circuit; the third decoding circuit is configured to perform decoding processing on the remaining multiple consecutive high-order bits of data in the signal to be decoded, so as to obtain a third decoded signal; the third decoded signal and the second decoded signal are the same; the first region select circuit is connected with the second decoding circuit and configured to output the second decoded signal when a first region enable signal is enabled; the second region select circuit is connected with the third decoding circuit and configured to output the third decoded signal when a second region enable signal is enabled; the first region enable signal/second region enable signal being enabled represents that a first region/second region of the semiconductor element is selected.

In some implementations, the first stage decoding circuit further comprises: a buffer; the buffer is connected with the first decoding circuit and configured to perform timing adjustment on the first decoded signal for synchronization with output signals of both the first region select circuit and the second region select circuit.

In some implementations, the first region select circuit/second region select circuit comprises: a first NAND gate and a second NAND gate; an input end of the first NAND gate is connected with an output of the second decoding circuit/the third decoding circuit, and the other input end is configured to receive a partition enable signal; the partition enable signal being enabled represents that the semiconductor element supports selection by partitions; an input end of the second NAND gate is connected with an output end of the first NAND gate, the other input end is configured to receive the first region enable signal/second region enable signal, and an output end is connected with the first output interface.

An example compositional circuit of the first stage decoding circuit here may be understood with reference to the example compositional circuit of the above first stage column decoding circuit, and an example compositional circuit of the second stage decoding circuit herein may be understood with reference to the example compositional circuit of the above second stage column decoding circuit.

In some implementations, the signal to be decoded comprises a column address signal; the transmission lines comprise address transmission lines; the semiconductor element comprises a block, and the plurality of structures to be selected comprise a plurality of bit lines; the decoded signal is indicative of selecting one of the plurality of bit lines.

It is to be understood that, references to "one example," "an example," "one implementation" or "an implementation" throughout this specification mean that example features, structures, or characteristics related to the implementations are included in at least one example of the present disclosure. Therefore, "in one example/implementation" or "in an example/implementation" presented everywhere throughout this specification does not necessarily refer to the same example. Furthermore, these example features, structures, or characteristics may be incorporated in one or more implementations in any suitable manner. It is to be understood that, in various implementations of the present disclosure, sequence numbers of the above processes do not indicate an execution sequence, and an execution sequence of various processes shall be determined by functionalities and intrinsic logics thereof, and shall constitute no limitation on an implementation process of the implementations of the present disclosure. The above sequence numbers of the implementations of the present disclosure are only for description, and do not represent advantages and disadvantages of the implementations.

The above descriptions are merely preferred implementations of the present disclosure, and are not intended to limit the patent scope of the present disclosure. Equivalent structure transformation made using the contents of the specification and the drawings of the present disclosure under the inventive concept of the present disclosure, or direct/indirect application to other related technical fields is encompassed within the patent protection scope of the present disclosure.

What is claimed is:

1. A memory device, comprising:
 a memory cell array comprising:
  at least one block comprising rows of word lines, columns of bit lines, and memory cells coupled between the word lines and the bit lines; and
 a peripheral circuit coupled with the memory cell array and comprising:
  a column decoding circuit coupled with the columns of bit lines and configured to:

receive a column address signal, perform multi-stage decoding on the column address signal, and output a column decoded signal indicative of enabling a select one of the bit lines in the block;

wherein the column decoding circuit comprises a first stage column decoding circuit comprising:

a first input interface configured to receive the column address signal, and a first output interface configured to output a preliminary column decoded signal, wherein a first number of transmission lines corresponding to the column address signal is less than a second number of transmission lines corresponding to the preliminary column decoded signal.

2. The memory device of claim 1, wherein the column decoding circuit further comprises:

a second stage column decoding circuit comprising:

a second input interface coupled with the first stage column decoding circuit and configured to receive the preliminary column decoded signal, and a second output interface coupled with the bit lines in the block and configured to output the column decoded signal, and wherein the second number of the transmission lines corresponding to the preliminary column decoded signal is less than a third number of transmission lines corresponding to the column decoded signal.

3. The memory device of claim 2, wherein:

the memory cell array comprises a plurality of banks, each of the banks comprising an array of blocks arranged in rows and columns; and each of the banks corresponds to a plurality of first stage column decoding circuits and a plurality of second stage column decoding circuits, each of the first stage column decoding circuits corresponds to one column of blocks, and each of the second stage column decoding circuits corresponds to one block of one column of blocks.

4. The memory device of claim 2, wherein the first stage column decoding circuit comprises:

a first decoding circuit configured to perform decoding processing on consecutive low-order bits of data in the column address signal to obtain a first decoded signal; and a second decoding circuit configured to perform decoding processing on consecutive high-order bits of data in the column address signal to obtain a second decoded signal, wherein the first decoded signal and the second decoded signal are configured to jointly form the preliminary column decoded signal.

5. The memory device of claim 4, wherein:

the first stage column decoding circuit further comprises a synchronization control signal generation circuit configured to generate a synchronization control signal corresponding to a clock period less than a first clock period corresponding to the first decoded signal and a second clock period corresponding to the second decoded signal;

the second input interface of the second stage column decoding circuit is further configured to receive the synchronization control signal; and the second stage column decoding circuit is configured to output the column decoded signal in response to an enabled state of the synchronization control signal, the first decoded signal, and the second decoded signal.

6. The memory device of claim 5, wherein the second stage column decoding circuit is further configured to:

receive the synchronization control signal and a block enable signal indicating a select one of the blocks; and in response to the preliminary column decoded signal, the synchronization control signal and the block enable signal, output the column decoded signal to enable the select one of the bit lines in the select one of the blocks.

7. The memory device of claim 4, wherein the first stage column decoding circuit further comprises:

a drive circuit comprising a plurality of drivers each connected with one transmission line corresponding to the first decoded signal and the second decoded signal and configured to perform power amplification processing on the first decoded signal or the second decoded signal on the one transmission line.

8. The memory device of claim 4, wherein:

a first numbers of a first subset of the bit lines disposed in a first region of the block is equal to a second numbers of a second subset of the bit lines disposed in a second region of the block; and the first stage column decoding circuit further comprises:

a third decoding circuit configured to perform decoding processing on the consecutive high-order bits of data in the column address signal to obtain a third decoded signal;

a first region select circuit connected with the second decoding circuit and configured to output the second decoded signal in response to a first region enable signal indicating that the first region of the block is selected; and a second region select circuit connected with the third decoding circuit and configured to output the third decoded signal in response to a second region enable signal indicating that the second region of the block is selected.

9. The memory device of claim 8, wherein the first stage column decoding circuit further comprises:

a buffer connected with the first decoding circuit and configured to perform timing adjustment to the first decoded signal for synchronizing output signals from the first region select circuit and the second region select circuit.

10. The memory device of claim 8, wherein:

the column address signal is 6-bit binary data;

the preliminary column decoded signal corresponds to 24 transmission lines;

the first region of the block comprises 64 bit lines; and the second region of the block comprises 64 bit lines.

11. The memory device of claim 3, further comprising:

a plurality of address transmission lines connected between the first stage column decoding circuits and the second stage column decoding circuits; and a plurality of data transmission lines connected to the array of blocks;

wherein the plurality of address transmission lines and the plurality of data transmission lines are disposed in a same metal layer.

12. The memory device of claim 3, wherein:

a first semiconductor structure including the memory cell array is stacked and bonded on a second semiconductor structure including the peripheral circuit in a vertical direction;

each of the first stage column decoding circuits is located on a side of one corresponding column of blocks; and

each of the second stage column decoding circuits is located overlap with one corresponding block in the vertical direction.

13. A memory system, comprising:
one or more memory devices each comprising:
  a memory cell array comprising:
    at least one block comprising rows of word lines, columns of bit lines, and memory cells coupled between the word lines and the bit lines, and
    a peripheral circuit coupled with the memory cell array and comprising a column decoding circuit coupled with the columns of bit lines and configured to receive a column address signal, perform multi-stage decoding on the column address signal, and output a column decoded signal indicative of enabling a select one of the bit lines in the block, wherein the column decoding circuit comprises a first stage column decoding circuit comprising:
    a first input interface configured to receive the column address signal, and
    a first output interface configured to output a preliminary column decoded signal,
    wherein a first number of transmission lines corresponding to the column address signal is less than a second number of transmission lines corresponding to the preliminary column decoded signal; and
  a memory controller coupled with the one or more memory devices and controlling the one or more memory devices.

14. The memory system of claim 13, wherein the column decoding circuit further comprises a second stage column decoding circuit comprising:
  a second input interface coupled with the first stage column decoding circuit and configured to receive the preliminary column decoded signal, and
  a second output interface coupled with the bit lines in the block and configured to output the column decoded signal, and
  wherein the second number of the transmission lines corresponding to the preliminary column decoded signal is less than a third number of transmission lines corresponding to the column decoded signal.

15. The memory system of claim 14, wherein:
the memory cell array comprises a plurality of banks, each of the banks comprising an array of blocks arranged in rows and columns; and
each of the banks corresponds to a plurality of first stage column decoding circuits and a plurality of second stage column decoding circuits, each of the first stage column decoding circuits corresponds to one column of blocks, and each of the second stage column decoding circuits corresponds to one block of one column of blocks.

16. The memory system of claim 14, wherein the first stage column decoding circuit comprises:
  a first decoding circuit configured to perform decoding processing on consecutive low-order bits of data in the column address signal to obtain a first decoded signal; and

28 a second decoding circuit configured to perform decoding processing on consecutive high-order bits of data in the column address signal to obtain a second decoded signal,
  wherein the first decoded signal and the second decoded signal are configured to jointly form the preliminary column decoded signal.

17. The memory system of claim 16, wherein:
the first stage column decoding circuit further comprises a synchronization control signal generation circuit configured to generate a synchronization control signal corresponding to a clock period less than a first clock period corresponding to the first decoded signal and a second clock period corresponding to the second decoded signal;
the second input interface of the second stage column decoding circuit is further configured to receive the synchronization control signal; and
the second stage column decoding circuit is configured to output the column decoded signal in response to an enabled state of the synchronization control signal, the first decoded signal, and the second decoded signal.

18. The memory system of claim 17, wherein the second stage column decoding circuit is further configured to:
receive the synchronization control signal and a block enable signal indicating a select one of the blocks; and
in response to the preliminary column decoded signal, the synchronization control signal and the block enable signal, output the column decoded signal to enable the select one of the bit lines in the select one of the blocks.

19. The memory system of claim 16, wherein the first stage column decoding circuit further comprises:
  a drive circuit comprising a plurality of drivers each connected with one transmission line corresponding to the first decoded signal and the second decoded signal and configured to perform power amplification processing on the first decoded signal or the second decoded signal on the one transmission line.

20. The memory system of claim 16, wherein:
a first numbers of a first subset of the bit lines disposed in a first region of the block is equal to a second numbers of a second subset of the bit lines disposed in a second region of the block; and
the first stage column decoding circuit further comprises:
  a third decoding circuit configured to perform decoding processing on the consecutive high-order bits of data in the column address signal to obtain a third decoded signal;
  a first region select circuit connected with the second decoding circuit and configured to output the second decoded signal in response to a first region enable signal indicating that the first region of the block is selected; and
  a second region select circuit connected with the third decoding circuit and configured to output the third decoded signal in response to a second region enable signal indicating that the second region of the block is selected.

\* \* \* \* \*